US011574915B2

(12) United States Patent
Choi et al.

(10) Patent No.: US 11,574,915 B2
(45) Date of Patent: Feb. 7, 2023

(54) SEMICONDUCTOR DEVICE INCLUDING INSULATING PATTERNS AND METHOD FOR FORMING THE SAME

(71) Applicant: Samsung Electronics Co., Ltd., Suwon-si (KR)

(72) Inventors: Wooyoung Choi, Seoul (KR); Woonghwi Bae, Hwaseong-si (KR); Jinwoo Bae, Yongin-si (KR); Chaelin Yoon, Yongin-si (KR); Sunghee Han, Hwaseong-si (KR); Sunwoo Heo, Suwon-si (KR); Deoksung Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 57 days.

(21) Appl. No.: 17/328,228

(22) Filed: May 24, 2021

(65) Prior Publication Data

US 2022/0181329 A1 Jun. 9, 2022

(30) Foreign Application Priority Data

Dec. 7, 2020 (KR) .................... 10-2020-0169242

(51) Int. Cl.
*H01L 27/108* (2006.01)

(52) U.S. Cl.
CPC .. *H01L 27/10897* (2013.01); *H01L 27/10814* (2013.01); *H01L 27/10823* (2013.01); *H01L 27/10894* (2013.01)

(58) Field of Classification Search
CPC ......... H01L 27/10897; H01L 27/10814; H01L 27/10823; H01L 27/10894; H01L 27/1085; H01L 27/10885; H01L 23/5223; H01L 23/50; H01L 23/5226; H01L 23/5283

See application file for complete search history.

(56) References Cited

U.S. PATENT DOCUMENTS

| | | | |
|---|---|---|---|
| 9,064,731 B2 | 6/2015 | Park | |
| 9,196,620 B2 | 11/2015 | Park et al. | |
| 9,431,324 B2 | 8/2016 | Shin | |
| 10,347,644 B2 | 7/2019 | Chang et al. | |
| 10,361,209 B2 | 7/2019 | Wang et al. | |
| 10,373,961 B2 | 8/2019 | Yoon et al. | |
| 11,063,049 B2 | 7/2021 | Hsu | |
| 2020/0194436 A1 | 6/2020 | Kim et al. | |
| 2022/0085028 A1* | 3/2022 | Kim | ........... H01L 27/10885 |
| 2022/0254787 A1* | 8/2022 | Kim | ........... H01L 27/10894 |

FOREIGN PATENT DOCUMENTS

TW     I701726 B     8/2020

* cited by examiner

*Primary Examiner* — Edward Chin
(74) *Attorney, Agent, or Firm* — Muir Patent Law, PLLC

(57) ABSTRACT

A semiconductor device includes first bit lines disposed on a substrate. Buried contacts disposed among first bit lines and connected to the substrate are provided. Landing pads are disposed on the buried contacts. Second bit lines are disposed on a peripheral area of the substrate. Upper surfaces of the second bit lines and the landing pads are coplanar with each other. First insulating patterns are disposed among the second bit lines. Second insulating patterns are disposed among the landing pads. Cell capacitors connected to the landing pads are disposed. The first insulating patterns include an insulating layer different from at least one insulating layer of the second insulating patterns.

20 Claims, 33 Drawing Sheets

FIG. 13
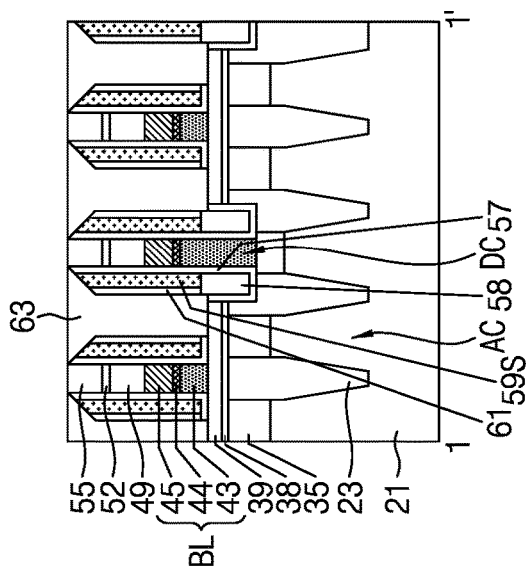
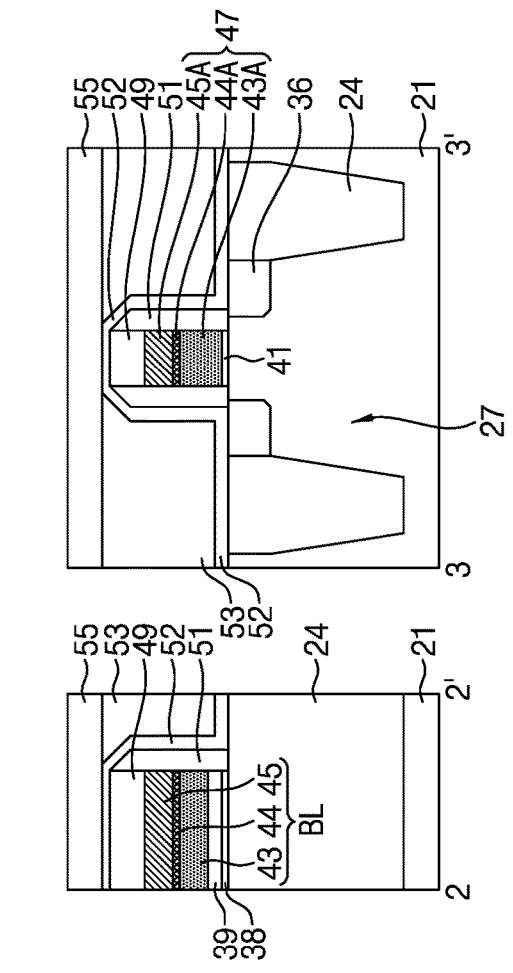
FIG. 14
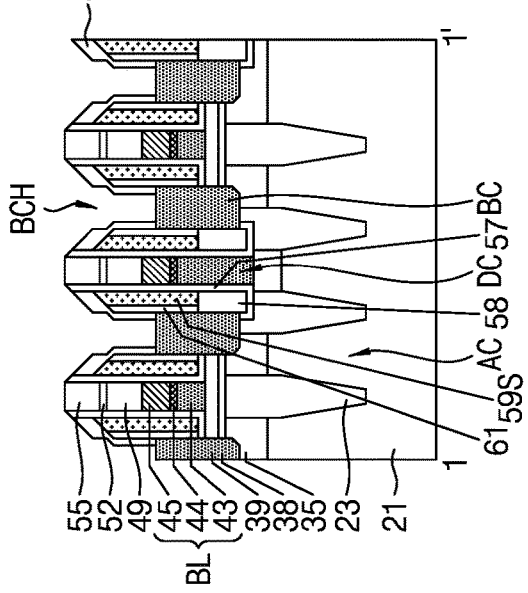
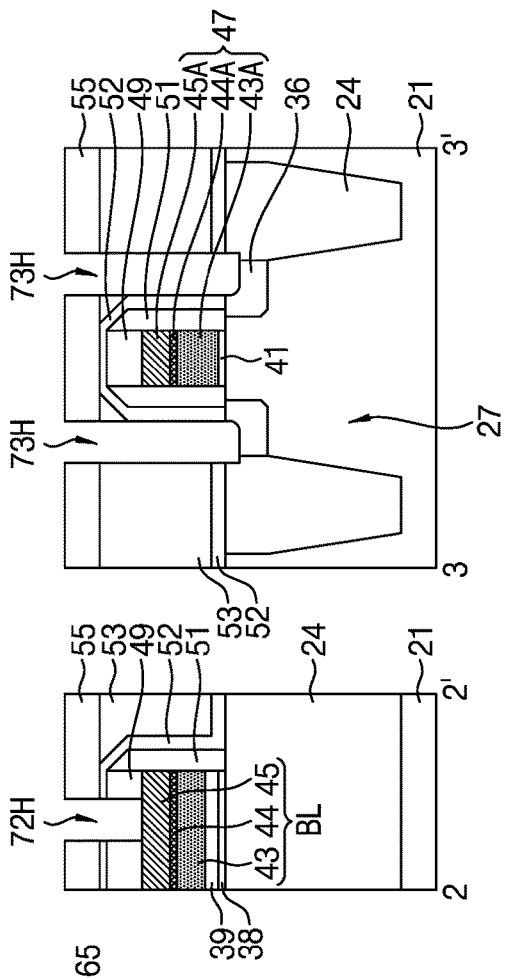

SEMICONDUCTOR DEVICE INCLUDING INSULATING PATTERNS AND METHOD FOR FORMING THE SAME

CROSS-REFERENCE TO THE RELATED APPLICATION

This non-provisional patent application claims priority under 35 U.S.C. § 119 to Korean Patent Application No. 10-2020-0169242, filed on Dec. 7, 2020, in the Korean Intellectual Property Office, the disclosure of which is herein incorporated by reference in its entirety.

BACKGROUND

1. Field

The exemplary embodiments of the disclosure relate to a semiconductor device including different insulating patterns and a method for forming the same.

2. Description of the Related Art

In accordance with an increase in integration degree of a semiconductor device, design rules for constituent elements of the semiconductor device are reduced. In a highly scaled down semiconductor device, it is more and more difficult to form a plurality of landing pads and a plurality of peripheral circuit wirings at the same level. New technology advantageous in terms of high integration while securing current driving capabilities of the plurality of landing pads and the plurality of peripheral circuit wirings is desirable.

SUMMARY

The exemplary embodiments of the disclosure provide a semiconductor device having excellent electrical characteristics while being advantageous in terms of high integration and a method for forming the same.

A semiconductor device according to exemplary embodiments of the disclosure includes a substrate including a cell area, and a peripheral area adjacent to the cell area. A plurality of first bit lines are disposed on the cell area of the substrate. A plurality of buried contacts disposed in spaces between first bit lines of the plurality of first bit lines and connected to the substrate are disposed. A plurality of landing pads are disposed on the plurality of buried contacts. A plurality of second bit lines disposed on the peripheral area of the substrate and connected to the plurality of first bit lines are provided. Upper surfaces of the plurality of second bit lines are coplanar with upper surfaces of the plurality of landing pads. A plurality of first insulating patterns are disposed between second bit lines of the plurality of second bit lines. A plurality of second insulating patterns are disposed between landing pads of the plurality of landing pads. An etch stop layer is provided on the plurality of landing pads, the plurality of second bit lines, the plurality of first insulating patterns and the plurality of second insulating patterns. A plurality of cell capacitors connected to the plurality of landing pads are disposed. The plurality of first insulating patterns includes an insulating layer different from at least one insulating layer of the plurality of second insulating patterns.

A semiconductor device according to exemplary embodiments of the disclosure includes a substrate including a first area, and a second area adjacent to the first area. A plurality of first horizontal wirings disposed on the first area of the substrate are disposed. A plurality of vertical wirings disposed in spaces between first horizontal wirings of the plurality of first horizontal wirings and connected to the substrate are provided. A plurality of landing pads are disposed on the plurality of vertical wirings. A plurality of second horizontal wirings disposed on the second area of the substrate and connected to the plurality of first horizontal wirings are provided. Upper surfaces of the plurality of second horizontal wirings are coplanar with upper surfaces of the plurality of landing pads. A plurality of first insulating patterns are disposed in spaces between second horizontal wirings of the plurality of second horizontal wirings. A plurality of second insulating patterns are disposed in spaces between landing pads of the plurality of landing pads. A plurality of lower electrodes are disposed on the plurality of landing pads. The plurality of first insulating patterns includes an insulating layer different from at least one insulating layer of the plurality of second insulating patterns.

A semiconductor device according to exemplary embodiments of the disclosure includes a substrate including a cell area, and a peripheral area adjacent to the cell area. A plurality of switching elements are disposed on the cell area of the substrate. A plurality of first bit lines disposed on the cell area of the substrate and connected to the plurality of switching elements are provided. A plurality of buried contacts disposed in spaces between first bit lines of the plurality of first bit lines and connected to the plurality of switching elements are provided. A plurality of landing pads are disposed on the plurality of buried contacts. A plurality of second bit lines disposed on the peripheral area of the substrate and connected to the plurality of first bit lines are provided. Upper surfaces of the second bit lines are coplanar with upper surfaces of the plurality of landing pads. A plurality of first insulating patterns are disposed in spaces between second bit lines of the plurality of second bit lines. A plurality of second insulating patterns are disposed in spaces between landing pads of the plurality of landing pads. An etch stop layer is disposed on the plurality of landing pads, the plurality of second bit lines, the plurality of first insulating patterns and the plurality of second insulating patterns. A plurality of storage nodes connected to the plurality of landing pads while extending through the etch stop layer are disposed. The plurality of first insulating patterns includes an insulating layer different from at least one insulating layer of the plurality of second insulating patterns.

BRIEF DESCRIPTION OF THE DRAWINGS

FIGS. 11 to 36 are cross-sectional views explaining semiconductor device formation methods according to exemplary embodiments of the disclosure.

DETAILED DESCRIPTION OF EXEMPLARY EMBODIMENTS

Figure 1:
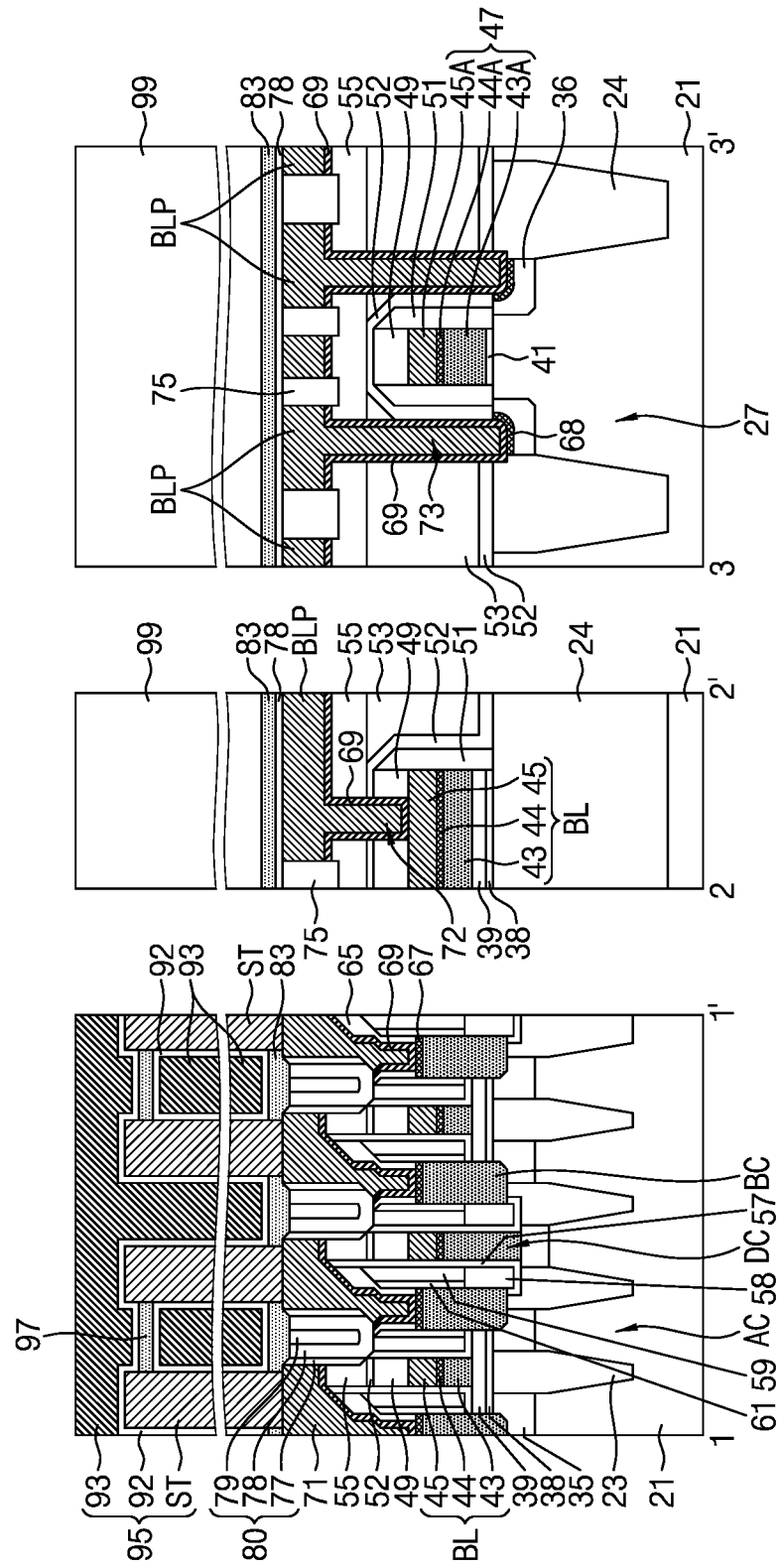
FIG. 1 is a cross-sectional views explaining a semiconductor device according to exemplary embodiments of the disclosure.
Figure 2:
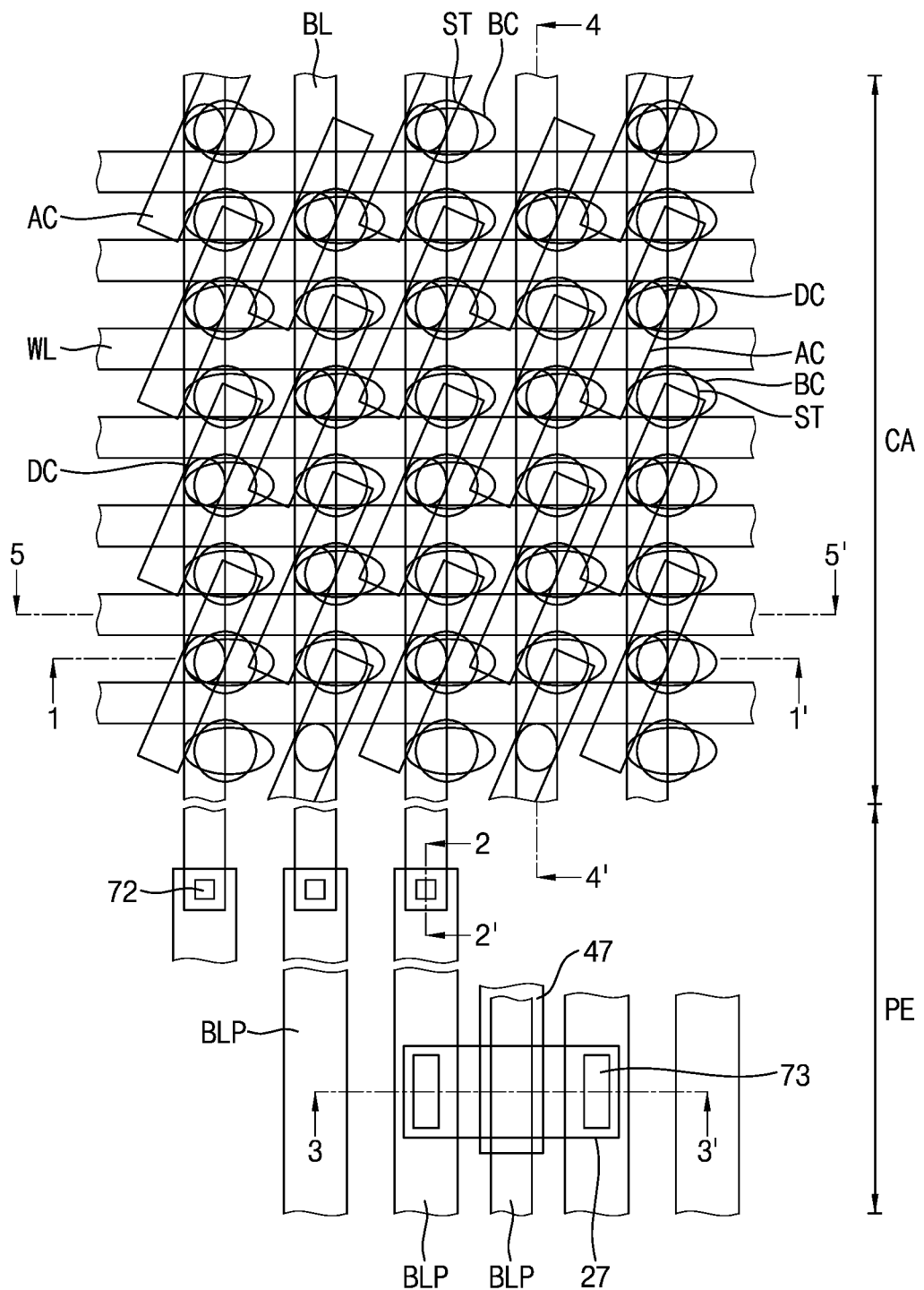
FIG. 2 is a layout explaining a semiconductor device according to exemplary embodiments of the disclosure.
Figure 4:
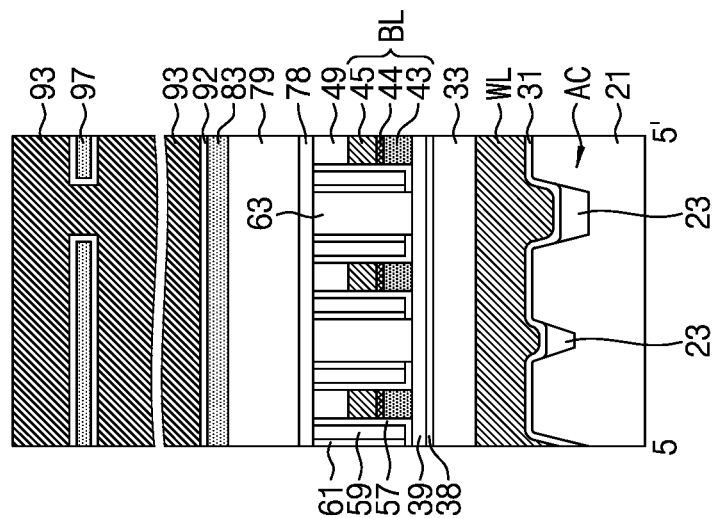
FIGS. 3 to 10 are cross-sectional views explaining semiconductor devices according to exemplary embodiments of the disclosure.
Figure 3:
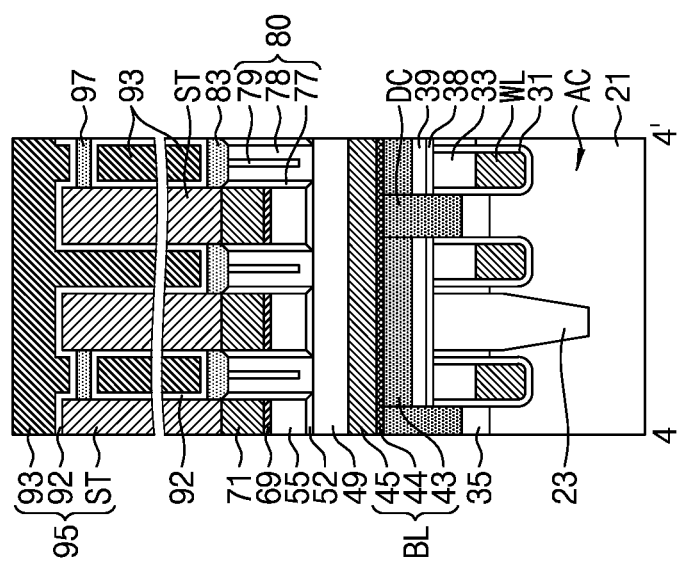

FIGS. 1, 3 and 4 are cross-sectional views explaining semiconductor devices according to exemplary embodiments of the disclosure. FIG. 2 is a layout explaining the semiconductor device. FIG. 1 may be a cross-sectional view taken along lines 1-1', 2-2' and 3-3' in FIG. 2. FIG. 3 may be a cross-sectional view taken along line 4-4' in FIG. 2. FIG. 4 may be a cross-sectional view taken along line 5-5' in FIG. 2. Semiconductor devices according to exemplary embodiments of the disclosure may include a memory device such as a dynamic random access memory (DRAM).

Referring to FIG. 1, a semiconductor device according to exemplary embodiments of the disclosure may include a substrate 21, a first element isolation layer 23, a second element isolation layer 24, a plurality of cell active regions AC, a peripheral active region 27, a plurality of cell source/drain regions 35, a plurality of peripheral source/drain regions 36, a first insulating layer 38, a second insulating layer 39, a peripheral gate dielectric layer 41, a peripheral gate electrode 47, a plurality of first capping patterns 49, a plurality of gate spacers 51, a plurality of second capping patterns 52, a third insulating layer 53, a plurality of third capping patterns 55, a plurality of direct contacts DC, a plurality of first bit lines BL, a plurality of inner spacers 57, a plurality of buried spacers 58, a plurality of air gaps 59, a plurality of outer spacers 61, a plurality of buried contacts BC, a plurality of upper spacers 65, a plurality of first metal silicide layers 67, a plurality of second metal silicide layers 68, a barrier layer 69, a plurality of landing pads 71, a bit contact plug 72, a plurality of peripheral contact plugs 73, a plurality of second bit lines BLP, a plurality of first insulating patterns 75, a plurality of second insulating patterns 80, an etch stop layer 83, a plurality of cell capacitors 95, a supporter 97, and a fifth insulating layer 99.

Each of the plurality of first bit lines BL may include a first bit conductive layer 43, a second bit conductive layer 44, and a third bit conductive layer 45. The peripheral gate electrode 47 may include a first gate conductive layer 43A, a second gate conductive layer 44A, and a third gate conductive layer 45A. Each of the plurality of second insulating patterns 80 may include a pad spacer layer 77, a spacer capping layer 78, and a filling layer 79. Each of the plurality of cell capacitors 95 may include a lower electrode ST, a capacitor dielectric layer 92, and an upper electrode 93.

Referring to FIG. 2, a semiconductor device according to exemplary embodiments of the disclosure may include a cell area CA, and a peripheral area PE adjacent to the cell area CA. In an embodiment, the peripheral area PE may include a core area and/or a peripheral circuit area. A plurality of cell active regions AC, a plurality of word lines WL, a plurality of direct contacts DC, a plurality of first bit lines BL, a plurality of buried contacts BC and a plurality of lower electrodes ST may be disposed at the cell area CA. Each of the plurality of lower electrodes ST may correspond to a storage node. A peripheral active region 27, a peripheral gate electrode 47, a plurality of bit contact plugs 72 (i.e., a plurality of bit line contact plugs), a plurality of peripheral contact plugs 73 and a plurality of second bit lines BLP may be disposed at the peripheral area PE.

Referring to FIG. 3, a semiconductor device according to exemplary embodiments of the disclosure may include a substrate 21, a first element isolation layer 23, a plurality of cell active regions AC, a cell gate dielectric layer 31, a plurality of word lines WL, a plurality of gate capping patterns 33, a plurality of cell source/drain regions 35, a first insulating layer 38, a second insulating layer 39, a plurality of direct contacts DC, a plurality of first bit lines BL, a first capping pattern 49, a plurality of second capping patterns 52, a plurality of third capping patterns 55, a barrier layer 69, a plurality of landing pads 71, a plurality of second insulating patterns 80, an etch stop layer 83, a plurality of cell capacitors 95, and a supporter 97.

Each of the plurality of first bit lines BL may include a first bit conductive layer 43, a second bit conductive layer 44, and a third bit conductive layer 45. Each of the plurality of second insulating patterns 80 may include a pad spacer layer 77, a spacer capping layer 78, and a filling layer 79. Each of the plurality of cell capacitors 95 may include a lower electrode ST, a capacitor dielectric layer 92, and an upper electrode 93.

The cell gate dielectric layer 31 may include or may be formed of silicon oxide, silicon nitride, silicon oxynitride, high-K dielectrics, or a combination thereof. The plurality of word lines WL may include or may be formed of a conductive material such as metal, metal silicide, metal nitride, metal oxide, polysilicon, conductive carbon, or a combination thereof. The plurality of gate capping patterns 33 may include or may be formed of an insulating material such as silicon oxide, silicon nitride, silicon oxynitride, low-K dielectrics, high-K dielectrics, or a combination thereof.

Referring to FIG. 4, a semiconductor device according to exemplary embodiments of the disclosure may include a substrate 21, a first element isolation layer 23, a plurality of cell active regions AC, a cell gate dielectric layer 31, a word line WL, a gate capping pattern 33, a first insulating layer 38, a second insulating layer 39, a plurality of first bit lines BL, a plurality of first capping patterns 49, a plurality of inner spacers 57, a plurality of air gaps 59, a plurality of outer spacers 61, a fourth insulating layer 63, a spacer capping layer 78, a filling layer 79, an etch stop layer 83, a capacitor dielectric layer 92, an upper electrode 93, and a supporter 97. Each of the plurality of first bit lines BL may include a first bit conductive layer 43, a second bit conductive layer 44, and a third bit conductive layer 45.

Referring to FIGS. 1 to 4, semiconductor devices according to exemplary embodiments of the disclosure may include the substrate 21 including the cell region CA and the peripheral area PE. The plurality of first bit lines BL may be disposed on the cell area CA of the substrate 21. The plurality of first bit lines BL may be parallel to each other. The plurality of buried contacts BC may be disposed in spaces among the plurality of first bit lines BL while being connected to the substrate 21. For example, each of the plurality of buried contacts BC may be connected to a corresponding one of the plurality of cell source/drain regions 35. The plurality of landing pads 71 may be disposed on the plurality of buried contacts BC. The plurality of second bit lines BLP may be disposed on the peripheral area PE of the substrate 21 while being connected to the plurality of first bit lines BL. Upper surfaces of the plurality of second bit lines BLP and the plurality of landing pads 71 may be substantially coplanar with each other. Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

The plurality of first insulating patterns 75 may be disposed among the plurality of second bit lines BLP. The plurality of second insulating patterns 80 may be disposed among the plurality of landing pads 71. The etch stop layer 83 may be disposed on the plurality landing pads 71, the plurality of second bit lines BLP, the plurality of first insulating patterns 75 and the plurality of second insulating patterns 80. The plurality of cell capacitors 95 may be connected to the plurality of landing pads 71. The plurality of first insulating patterns 75 may include or may be a layer formed through a process different from a process in which the plurality of second insulating patterns 80 are formed such that the layer of the plurality of first insulating patterns 75 differs from that of the plurality of second insulating patterns 80. The plurality of first insulating patterns 75 may include or may be formed of an insulating material such as silicon oxide, silicon nitride, silicon oxynitride, low-K dielectrics, high-K dielectrics, or a combination thereof. For example, the plurality of first insulating patterns 75 may include or may be formed of silicon nitride. In an embodiment, the plurality of second bit lines BLP may include or may be formed of a material layer formed simultaneously with that of the plurality of landing pads 71 using the same process as that of the plurality of landing pads 71 such that the material layer is the same as that of the plurality of landing pads 71. For example, the plurality of second bit lines BLP may include or may be formed of the same material layer as that of the plurality of landing pads 71. In an embodiment, the plurality of second bit lines BLP and the plurality of landing pads 71 are formed using the same process to have the same material layer.

In an embodiment, each of the plurality of second insulating patterns 80 may include the filling layer 79, the spacer capping layer 78, which surrounds a side surface and a bottom of the filling layer 79, and the pad spacer layer 77 outside the spacer capping layer 78. The plurality of first insulating patterns 75 may include or may be formed of a layer formed through a process different from a process in which the filling layer 79, the spacer capping layer 78 and the pad spacer layer 77 are formed such that the layer of the plurality of first insulating patterns 75 differs from those of the filling layer 79, the spacer capping layer 78 and the pad spacer layer 77. In an embodiment, the layer of the plurality of first insulating patterns 75 differs from at least one of the filling layer 79, the spacer capping layer 78 and the pad spacer layer 77. The plurality of first insulating patterns 75 may contact side surfaces of the plurality of second bit lines BLP. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

In an embodiment, the filling layer 79, the spacer capping layer 78, and the pad spacer layer 77 are not present among side surfaces of the plurality of first insulating patterns 75 and the plurality of second bit lines BLP. The spacer capping layer 78 may extend between the etch stop layer 83 and the plurality of first insulating patterns 75 and between etch stop layer 83 and the plurality of second bit lines BLP. The filling layer 79 and the pad spacer layer 77 may include or may be formed of silicon nitride. The spacer capping layer 78 may include SiCN.

In an embodiment, the plurality of inner spacers 57 may be disposed on side surfaces of the plurality of first bit lines BL. Each inner spacer 57 may extend along a side surface of a corresponding first bit line BL and an upper surface of the second insulating layer 39. In an embodiment, a pair of two inner spacers 57 are disposed on the opposite side surfaces of a first bit line BL, and two inner spacers 57 have left-right symmetry about the first bit line BL. The plurality of outer spacers 61, which faces the plurality of inner spacers 57, may be disposed. The plurality of outer spacers 61 may be spaced apart from the plurality of inner spacers 57. The plurality of air gaps 59 may be disposed between the plurality of inner spacers 57 and the plurality of outer spacers 61. The plurality of air gaps 59 may be disposed between the plurality of first bit lines BL and the plurality of buried contacts BC. The spacer capping layer 78 may be exposed at upper ends of the plurality of air gaps 59. The spacer capping layer 78 may cover a top of each of the plurality of air gaps 59. The term "air" as discussed herein, may refer to atmospheric air, or other gases that may be present during the manufacturing process.

In an embodiment, the plurality of first bit lines BL may extend toward the plurality of second bit lines BLP on the peripheral area PE of the substrate 21. The plurality of bit contact plugs 71 may be disposed between the plurality of first bit lines BL and the plurality of second bit lines BLP while being adjacent to a boundary between the cell region CA and the peripheral region PE. The uppermost ends of the plurality of second bit lines BLP may be relatively farther from a surface of the substrate 21 than the uppermost ends of the plurality of first bit lines BL. The plurality of second bit lines BLP may be disposed at a level higher than the plurality of first bit lines BL. Each of the plurality of bit contact plugs 72 may be in continuity with a corresponding one of the plurality of second bit lines BLP. The plurality of bit contact plugs 72 may include or may be formed of the same material as the plurality of second bit lines BLP.

In an embodiment, the lower electrode ST may extend through the etch stop layer 83 and, as such, may contact a corresponding one of the plurality of landing pads 71. The upper electrode 93 may face or vertically overlap the lower electrode ST. The capacitor dielectric layer 92 may be disposed between the lower electrode ST and the upper electrode 93.

In an embodiment, the cell area CA may correspond to a first area, and the peripheral area PE may correspond to a second area. The plurality of first bit lines BL may correspond to a plurality of first horizontal wirings. The plurality of buried contacts BC may correspond to a plurality of vertical wirings. The plurality of second bit lines BLP may correspond to a plurality of second horizontal wirings. Upper surfaces of the plurality of second horizontal wirings and the plurality of landing pads 71 may be substantially coplanar with each other. The filling layer 79 may correspond to a first insulating layer. The spacer capping layer 78 may correspond to a second insulating layer. The pad spacer layer 77 may correspond to a third insulating layer. The second insulating layer may include may be formed of a material different from those of the first insulating layer and the third insulating layer. The plurality of first insulating patterns 75 may include or may be formed of an insulating layer different from those of the first insulating layer, the second insulating layer and the third insulating layer. For example, an insulating material of the plurality of first insulating patterns 75 may be different from those of the first insulating layer, the second insulating layer and the third insulating layer or at least one thereof.

In an embodiment, the plurality of cell active regions AC, the cell gate dielectric layer 31, the plurality of word lines WL, and the plurality of cell source/drain regions 35 may correspond to a plurality of switching elements. The plurality of switching elements may include a fin field effect transistor (finFET), a multi-bridge channel transistor such as an MBCFET®, a nano-wire transistor, a vertical transistor, a recess channel transistor, a 3-D transistor, a planar transistor, or a combination thereof. For example, the plurality of first bit lines BL may be connected to the plurality of switching elements. For example, the plurality of first bit lines BL may be connected to the plurality of cell source/drain regions 35 via the plurality of direct contacts DC. The plurality of buried contacts BC may be connected to the plurality of switching elements.

FIGS. 5 to 10 are cross-sectional views taken along lines 1-1', 2-2' and 3-3' in FIG. 2 in order to explain semiconductor devices according to exemplary embodiments of the disclosure.

Figure 5:
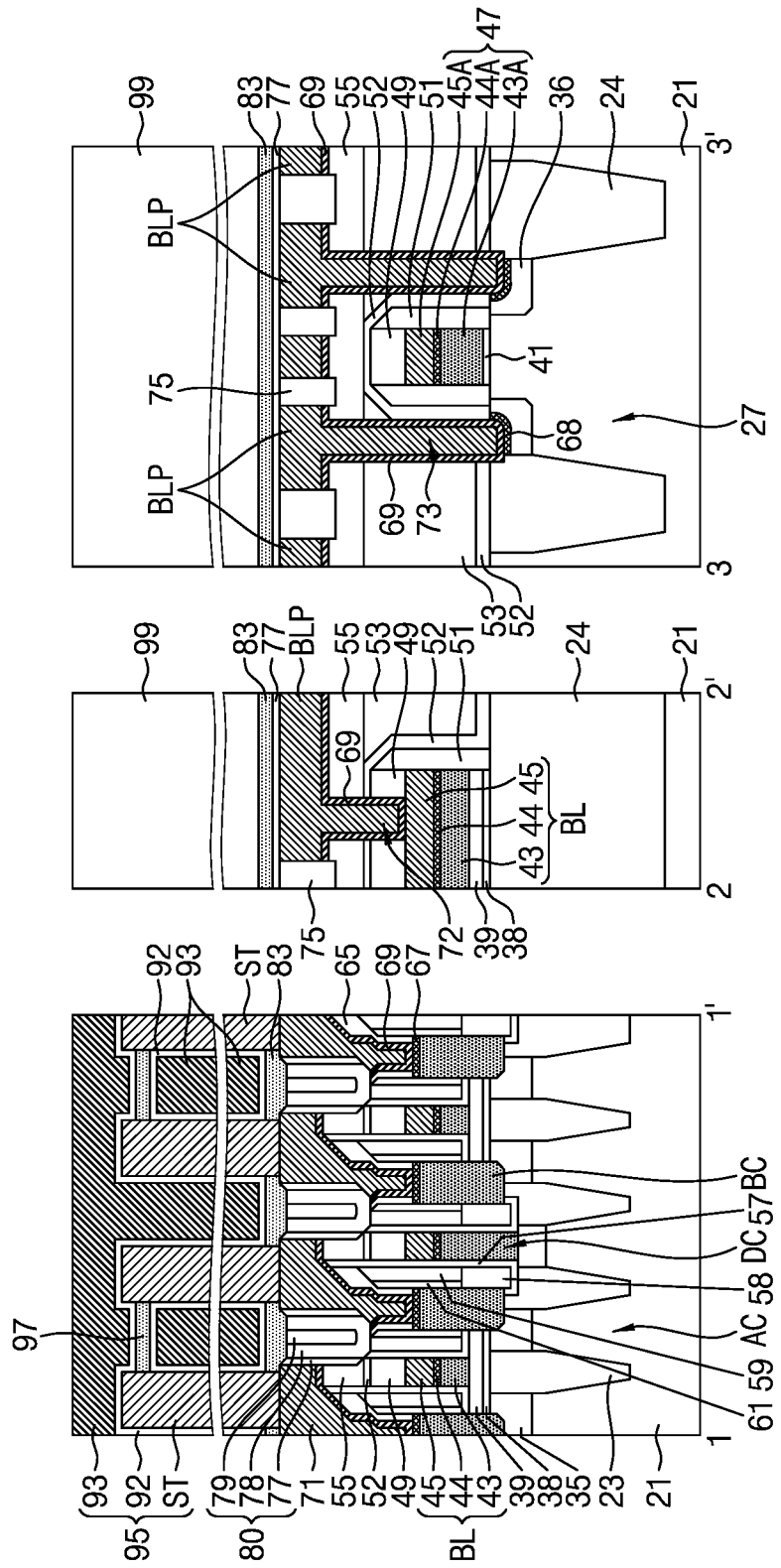

Referring to FIG. 5, a pad spacer layer 77 may extend between an etch stop layer 83 and a plurality of first insulating patterns 75 and between the etch stop layer 83 and a plurality of second bit lines BLP.

Figure 6:
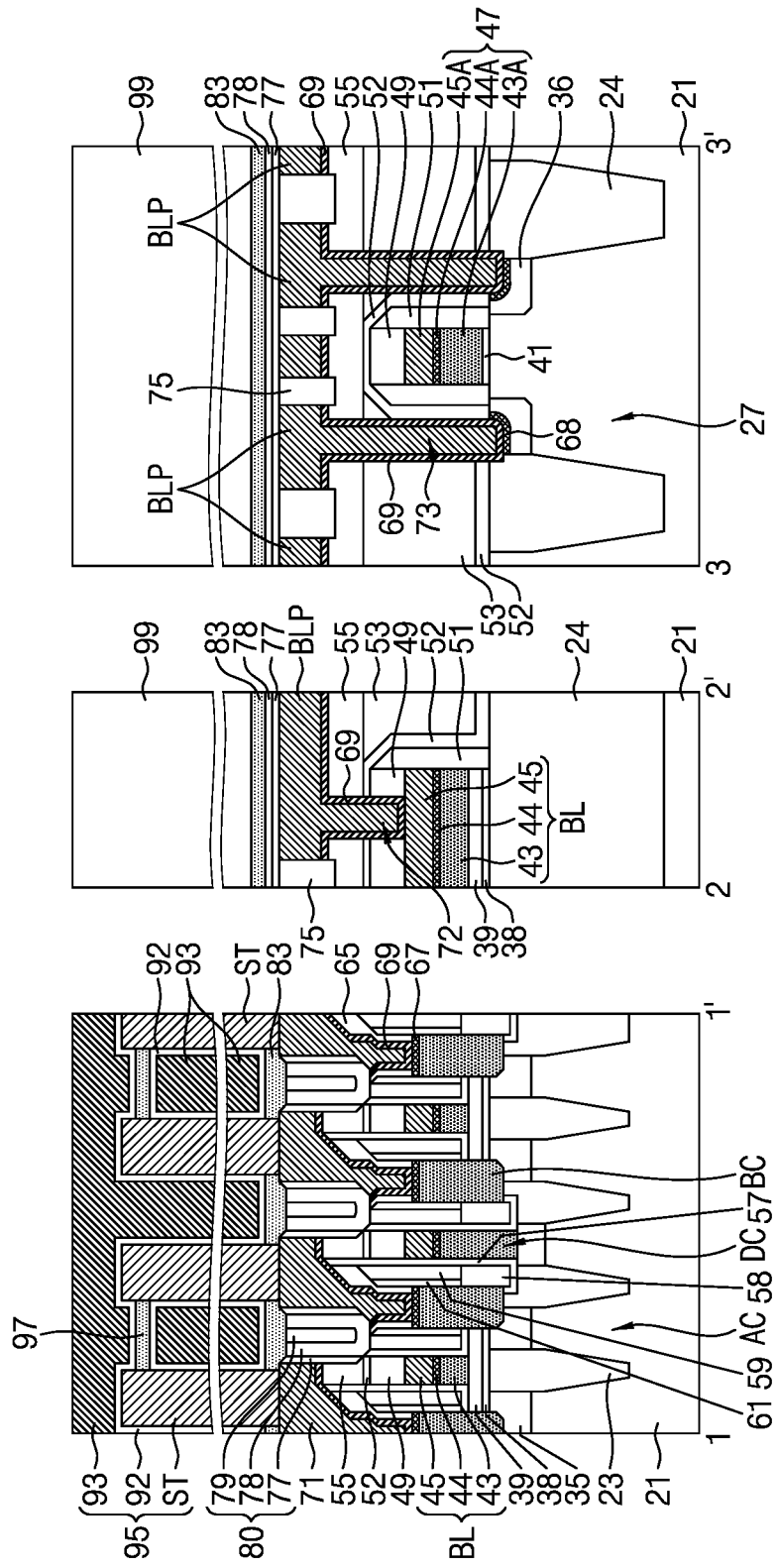

Referring to FIG. 6, a pad spacer layer 77 and a spacer capping layer 78 may extend between an etch stop layer 83 and a plurality of first insulating patterns 75 and between the etch stop layer 83 and a plurality of second bit lines BLP.

Figure 7:
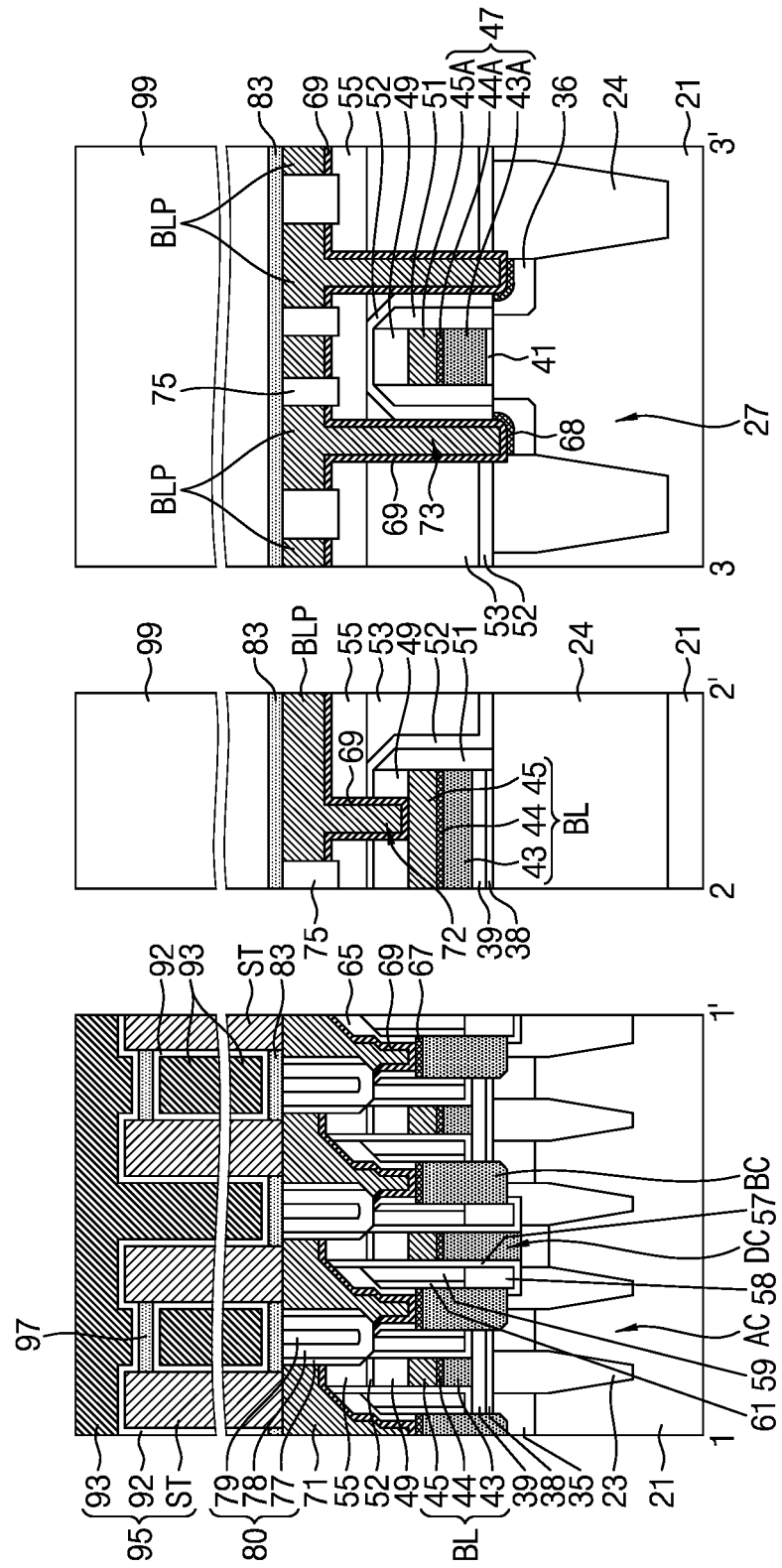

Referring to FIG. 7, upper surfaces of a plurality of landing pads 71, a plurality of second bit lines BLP, a plurality of first insulating patterns 75 and a plurality of second insulating patterns 80 may be substantially coplanar with each other. An etch stop layer 83 may be disposed on the plurality of landing pads 71, the plurality of second bit lines BLP, the plurality of first insulating patterns 75 and the plurality of second insulating patterns 80. The etch stop layer 83 may contact the upper surfaces of the plurality of landing pads 71, the plurality of second bit lines BLP, the plurality of first insulating patterns 75 and the plurality of second insulating patterns 80.

Figure 8:
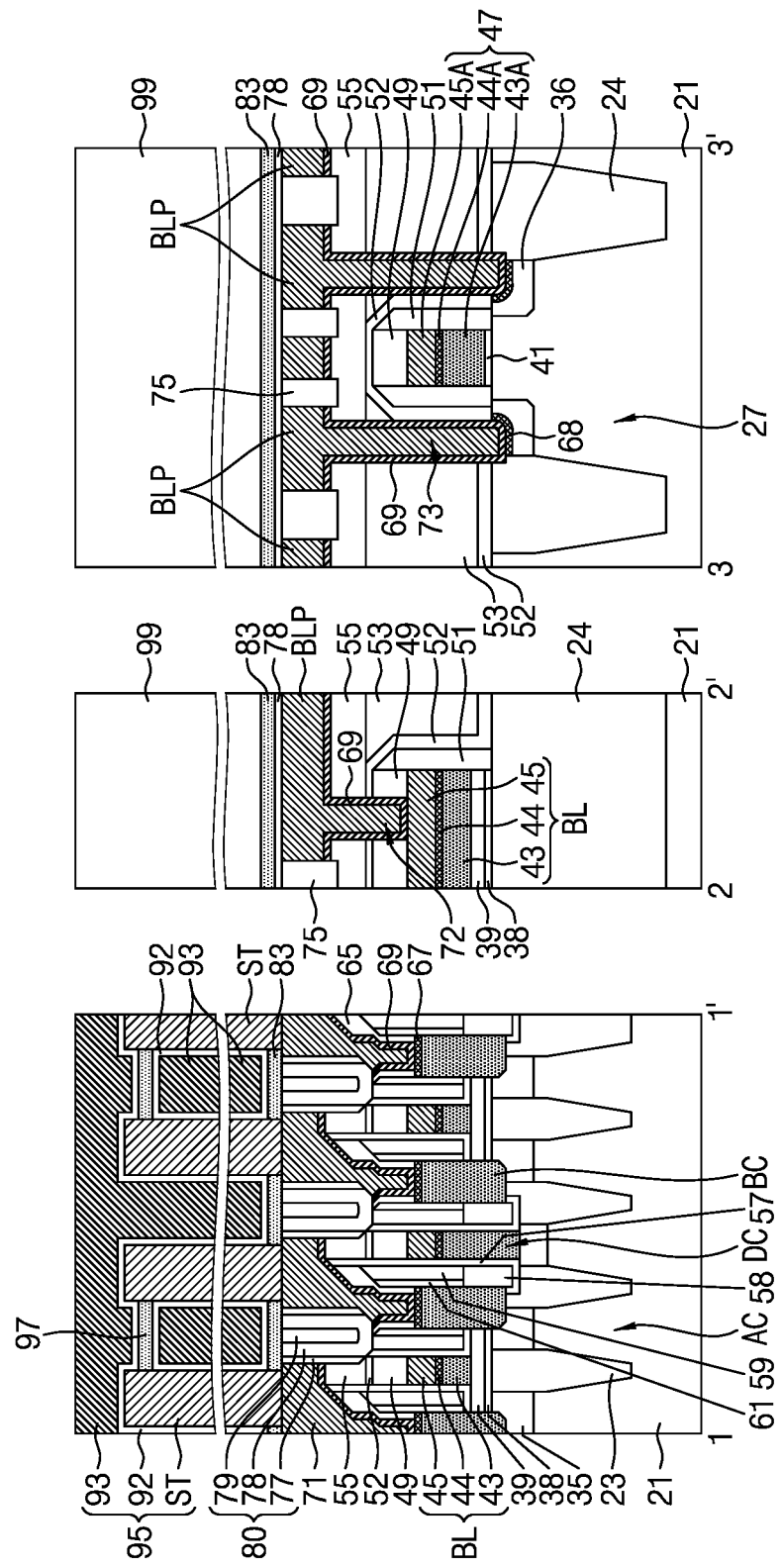

Referring to FIG. 8, upper surfaces of a plurality of landing pads 71, a plurality of second bit lines BLP, a plurality of first insulating patterns 75 and a plurality of second insulating patterns 80 may be substantially coplanar with each other. A spacer capping layer 78 may extend between an etch stop layer 83 and the plurality of first insulating patterns 75 and between the etch stop layer 83 and the plurality of second bit lines BLP.

Figure 9:
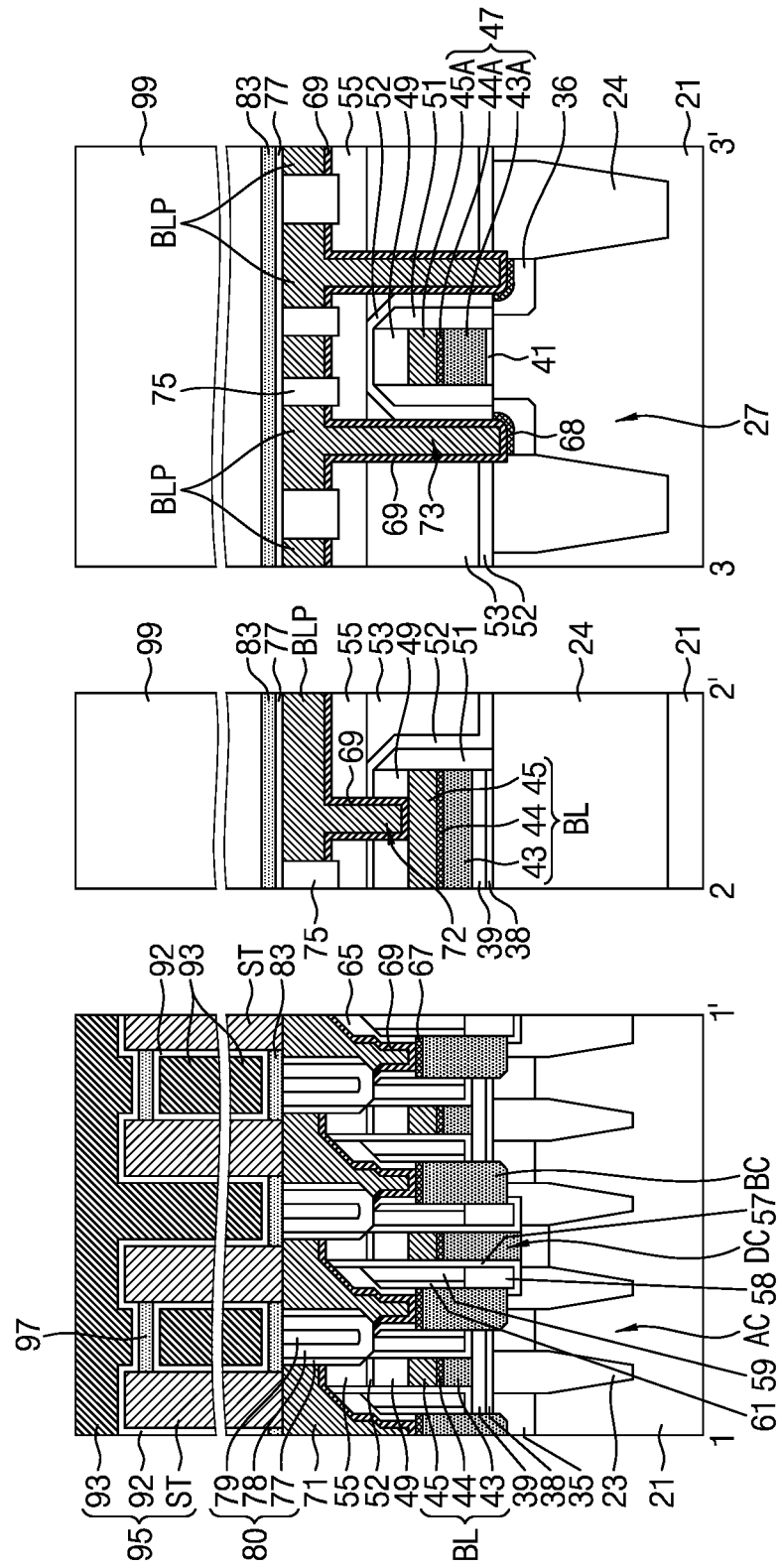

Referring to FIG. 9, upper surfaces of a plurality of landing pads 71, a plurality of second bit lines BLP, a plurality of first insulating patterns 75 and a plurality of second insulating patterns 80 may be substantially coplanar with each other. A pad spacer layer 77 may extend between an etch stop layer 83 and the plurality of first insulating patterns 75 and between the etch stop layer 83 and the plurality of second bit lines BLP.

Figure 10:
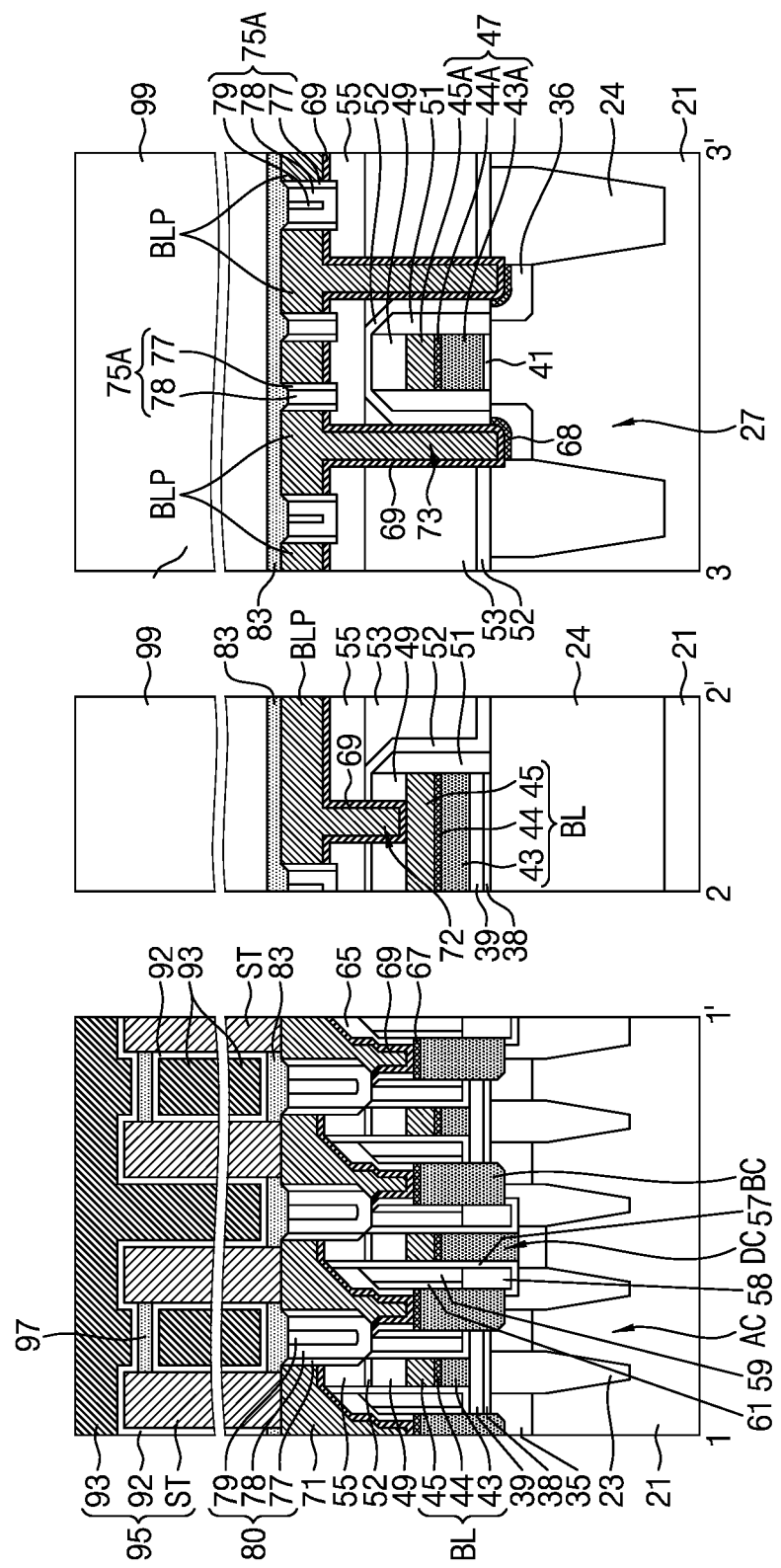

Referring to FIG. 10, each of a plurality of first insulating patterns 75A may include or may be formed of a material layer formed simultaneously with that of a plurality of second insulating patterns 80 using the same process as that of the plurality of second insulating patterns 80 such that the plurality of first insulating patterns 75A and the plurality of second insulating patterns 80 include the same material layer. For example, some of the plurality of first insulating patterns 75A may include or may be formed of all of a pad spacer layer 77, a spacer capping layer 78 and a filling layer 79. The others of the plurality of first insulating patterns 75A may include or may be formed of the pad spacer layer 77 and the spacer capping layer 78.

FIGS. 11 to 21 are cross-sectional views taken along lines 1-1', 2-2' and 3-3' in FIG. 2 in order to explain semiconductor device formation methods according to exemplary embodiments of the disclosure.

Figure 11:
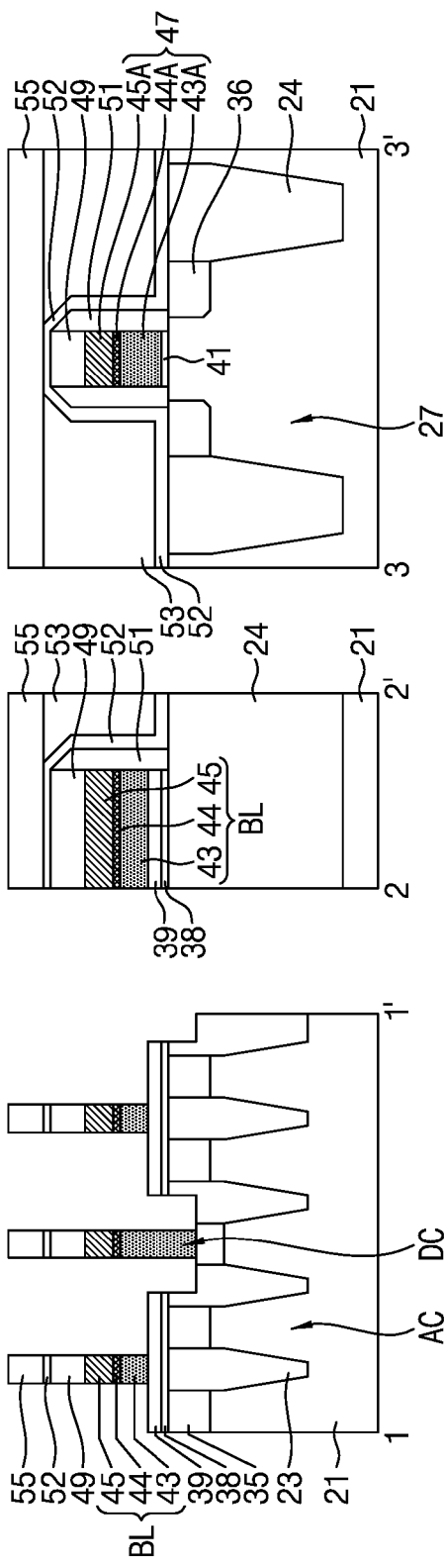

Referring to FIGS. 2 and 11, a first element isolation layer 23, a second element isolation layer 24, a plurality of cell active regions AC, a peripheral active region 27, a plurality of cell source/drain regions 35, a plurality of peripheral source/drain regions 36, a first insulating layer 38, a second insulating layer 39, a peripheral gate dielectric layer 41, a peripheral gate electrode 47, a plurality of first capping patterns 49, a plurality of gate spacers 51, a plurality of second capping patterns 52, a third insulating layer 53, a plurality of third capping patterns 55, a plurality of direct contacts DC, and a plurality of first bit lines BL may be formed on a substrate 21 including a cell area CA and a peripheral area PE. Each of the plurality of first bit lines BL may include a first bit conductive layer 43, a second bit conductive layer 44, and a third bit conductive layer 45. The peripheral gate electrode 47 may include a first gate conductive layer 43A, a second gate conductive layer 44A, and a third gate conductive layer 45A. Although a cell gate dielectric layer 31, a plurality of word lines WL, and a plurality of gate capping patterns 33 may be formed on the substrate 21, as shown in FIGS. 3 and 4, no illustration thereof will be given for brief description.

The substrate 21 may include or may be formed of a semiconductor substrate such as a silicon wafer or a silicon-on-insulator (SOI) wafer. For example, the substrate 21 may be a monocrystalline silicon wafer including (i.e., doped with) p-type impurities. The first element isolation layer 23 may be formed at the cell area CA of the substrate 21, to define the plurality of cell active regions AC. The second element isolation layer 24 may be formed at the peripheral area PE of the substrate 21, to define the peripheral active region 27. Each of the first element isolation layer 23 and the second element isolation layer 24 may be formed using trench isolation technology. The horizontal width of the second element isolation layer 24 may be greater than the horizontal width of the first element isolation layer 23. The lowermost end of the second element isolation layer 24 may be formed at a lower level than the lowermost end of the first element isolation layer 23.

Each of the first element isolation layer 23, the second element isolation layer 24, the first insulating layer 38, the second insulating layer 39, the plurality of first capping patterns 49, the plurality of second capping patterns 52, the third insulating layer 53 and the plurality of third capping patterns 55 may be a single layer or multiple layers. Each of the first element isolation layer 23, the second element isolation layer 24, the first insulating layer 38, the second insulating layer 39, the plurality of first capping patterns 49, the plurality of second capping patterns 52, the third insulating layer 53 and the plurality of third capping patterns 55 may include or may be formed of an insulating material such as silicon oxide, silicon nitride, silicon oxynitride, low-K dielectrics, high-K dielectrics, or a combination thereof.

The plurality of cell source/drain regions 35 may be formed in the plurality of cell active regions AC. The first insulating layer 38 and the second insulating layer 39 may be sequentially stacked on the substrate 21 including the plurality of cell source/drain regions 35. The second insulating layer 39 may include or may be formed of a material different from that of the first insulating layer 38. In an embodiment, the second insulating layer 39 may be thicker than the first insulating layer 38.

The first insulating layer 38 and the second insulating layer 39 may be partially removed and, as such, an upper surface of the peripheral active region 27 may be exposed. The peripheral gate dielectric layer 41 may be formed on the peripheral active region 27. The peripheral gate dielectric layer 41 may include or may be formed of silicon oxide, silicon nitride, silicon oxynitride, high-K dielectrics, or a combination thereof.

The plurality of direct contacts DC and the plurality of first bit lines BL may be formed at the cell area CA of the substrate 21. Each of the plurality of direct contacts DC may extend through the first bit conductive layer 43, the second insulating layer 39 and the first insulating layer 38 and, as such, may contact a corresponding one of the plurality of cell source/drain regions 35. The first bit conductive layer 43 may be formed on the second insulating layer 39. The second bit conductive layer 44 may be formed on the first bit conductive layer 43 and the plurality of direct contacts DC. The third bit conductive layer 45 may be formed on the second bit conductive layer 44.

The peripheral gate electrode 47 may be formed to extend across the peripheral active region 27. The first gate conductive layer 43A may be formed on the peripheral gate dielectric layer 41. The second gate conductive layer 44A may be formed on the first gate conductive layer 43A. The third gate conductive layer 45A may be formed on the second gate conductive layer 44A.

Each of the plurality of direct contacts DC, the first bit conductive layer 43, the second bit conductive layer 44, the third bit conductive layer 45, the first gate conductive layer 43A, the second gate conductive layer 44A and the third gate conductive layer 45A may include or may be formed of a conductive material such as metal, metal silicide, metal nitride, metal oxide, polysilicon, conductive carbon, or a combination thereof.

In an embodiment, the first gate conductive layer 43A may include or may be formed of a material layer formed simultaneously with that of the first bit conductive layer 43 such that the first gate conductive layer 43A and the first bit conductive layer 43 may include or may be formed of the same material layer. For example, the first bit conductive layer 43 and the first gate conductive layer 43A may include or may be formed of a polysilicon layer. In an embodiment, the plurality of direct contacts DC may include or may be formed of substantially the same material as the first bit conductive layer 43. For example, the plurality of direct contacts DC may include a polysilicon layer. In an embodiment, the second gate conductive layer 44A may include or may be formed of a material layer formed simultaneously with that of the second bit conductive layer 44 such that the second gate conductive layer 44A and the second bit conductive layer 44 may include or may be formed of the same material layer. For example, the second bit conductive layer 44 and the second gate conductive layer 44A may include or may be formed of a metal silicide layer. In an embodiment, the third gate conductive layer 45A may include or may be formed of a material layer formed simultaneously with that of the third bit conductive layer 45 such that the third gate conductive layer 45A and the third bit conductive layer 45 may include or may be formed of the same material layer. For example, the third bit conductive layer 45 and the third gate conductive layer 45A may include or may be formed of W, WN, Ti, TiN, Ta, TaN, Ni, Co, Al, Ag, Pt, Au, Ru, Cr, Sn, or a combination thereof.

The plurality of first capping patterns 49 may be formed on the plurality of first bit lines BL and the peripheral gate electrode 47. The plurality of gate spacers 51 may be formed on side surfaces of the peripheral gate electrode 47. Portions of the plurality of gate spacers 51 may extend on side surfaces of the plurality of first capping patterns 49. The plurality of peripheral source/drain regions 36 may be formed in the peripheral active region 27 adjacent opposite sides of the peripheral gate electrode 47. The plurality of gate spacers 51 may be a single layer or multiple layers. The plurality of gate spacers 51 may include or may be formed of an insulating material such as silicon oxide, silicon nitride, silicon oxynitride, low-K dielectrics, high-K dielectrics, or a combination thereof.

The plurality of first bit lines BL may extend into the peripheral area PE. For example, the plurality of first bit lines BL may extend on the second element isolation layer 24 adjacent to a boundary between the cell area CA and the peripheral area PE. The first insulating layer 38 and the second insulating layer 39 may be disposed between the plurality of first bit lines BL and the second element isolation layer 24. The plurality of gate spacers 51 may be formed on one-side surfaces of the first insulating layer 38, the second insulating layer 39, the plurality of first bit lines BL and the plurality of first capping patterns 49. For example, a pair of two gate spacers 51 may be on opposite side surfaces of a stacked structure of the first insulating layer 38, the second insulating layer 39, the plurality of first bit lines BL and the plurality of first capping patterns 49.

The plurality of second capping patterns 52 may be formed on the plurality of first capping patterns 49, the plurality of gate spacers 51, the plurality of peripheral source/drain regions 36 and the second element isolation layer 24. The third insulating layer 53 may be formed on the plurality of second capping patterns 52. The third insulating layer 53 may be partially removed using a planarization process and, as such, portions of upper surfaces of the plurality of second capping patterns 52 may be exposed from the planarized third insulating layer 53. The plurality of third capping patterns 55 may be formed on the plurality of second capping patterns 52 and the third insulating layer 53.

Formation of the plurality of direct contacts DC and the plurality of first bit lines BL may include a plurality of thin film formation processes and a plurality of patterning processes. The plurality of first capping patterns 49, the plurality of second capping patterns 52 and the plurality of third capping patterns 55 may be sequentially stacked on the plurality of first bit lines BL. The plurality of first capping patterns 49, the plurality of second capping patterns 52 and the plurality of third capping patterns 55 may be vertically aligned on the plurality of first bit lines BL. Side surfaces of the plurality of direct contacts DC, the plurality of first bit lines BL, the plurality of first capping patterns 49, the plurality of second capping patterns 52 and the plurality of third capping patterns 55 may be vertically aligned. In an embodiment, the side surfaces of the plurality of direct contacts DC, the plurality of first bit lines BL, the plurality of first capping patterns 49, the plurality of second capping patterns 52 and the plurality of third capping patterns 55 may be substantially coplanar with each other.

Figure 12:
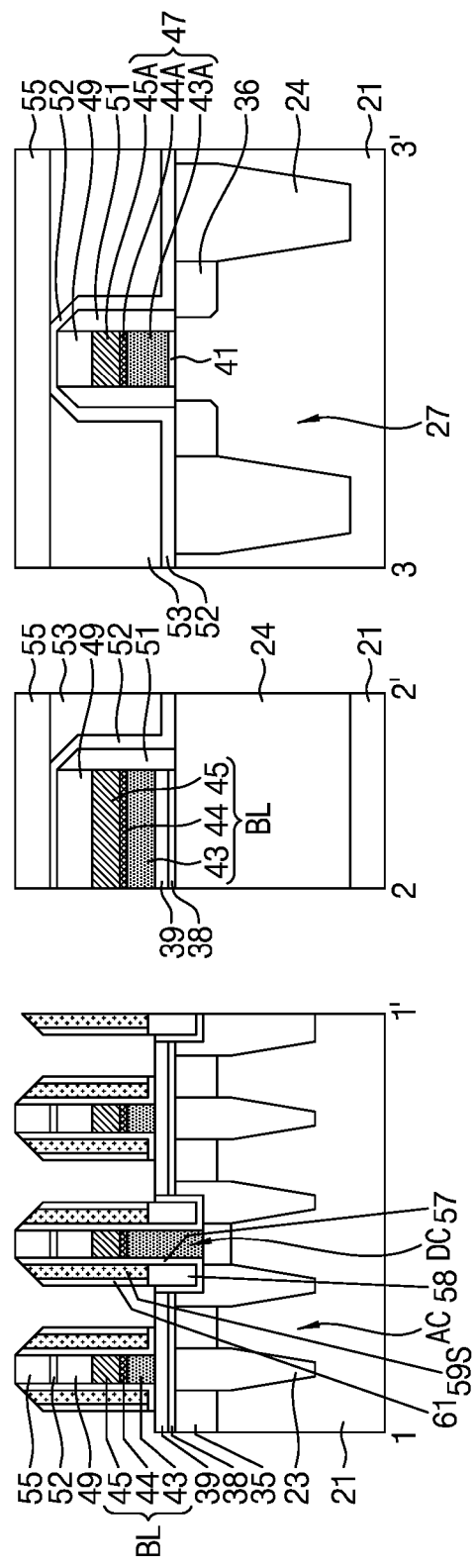

Referring to FIGS. 2 and 12, a plurality of inner spacers 57 may be formed on the side surfaces of the plurality of direct contacts DC, the plurality of first bit lines BL, the plurality of first capping patterns 49, the plurality of second capping patterns 52 and the plurality of third capping patterns 55. A plurality of buried spacers 58 may be formed on the plurality of inner spacers 57. The plurality of buried spacers 58 may be aligned on the side surfaces of the plurality of direct contacts DC. The plurality of buried spacers 58 may fill spaces between the plurality of direct contacts DC and the first insulating layer 38 and between the plurality of direct contacts DC and the second insulating layer 39.

A plurality of sacrificial spacers 59S may be formed outside the plurality of inner spacers 57. The plurality of sacrificial spacers 59S may be formed over the plurality of buried spacers 58. A plurality of outer spacers 61 may be formed outside the plurality of sacrificial spacers 59S. The plurality of sacrificial spacers 59S and the plurality of outer spacers 61 may cover the side surfaces of the plurality of first bit lines BL.

Each of the plurality of inner spacers 57, the plurality of buried spacers 58, the plurality of sacrificial spacers 59S and the plurality of outer spacers 61 may include or may be formed of an insulating material such as silicon oxide, silicon nitride, silicon oxynitride, low-K dielectrics, high-K dielectrics, or a combination thereof. The plurality of inner spacers 57, the plurality of buried spacers 58, the plurality of sacrificial spacers 59S and the plurality of outer spacers 61 may include or may be formed of different materials from each other.

In an embodiment, the plurality of sacrificial spacers 59S may include or may be formed of a material different from those of the plurality of inner spacers 57 and the plurality of outer spacers 61. For example, the plurality of sacrificial spacers 59S may include or may be formed of an oxide such as silicon oxide. Each of the plurality of inner spacers 57 and the plurality of outer spacers 61 may include or may be formed of a nitride such as silicon nitride.

Referring to FIGS. 2 and 13, a fourth insulating layer 63 may be formed in spaces among the plurality of first bit lines BL. Formation of the fourth insulating layer 63 may include a thin film formation process and a planarization process. The planarization process may include a chemical mechanical polishing (CMP) process, an etch-back process, or a combination thereof. In an embodiment, upper surfaces of the fourth insulating layer 63 and the plurality of third capping patterns 55 may be substantially coplanar with each other. The fourth insulating layer 63 may include or may be formed of an insulating material such as silicon oxide, silicon nitride, silicon oxynitride, low-K dielectrics, high-K dielectrics, or a combination thereof. For example, the fourth insulating layer 63 may include or may be formed of silicon oxide.

Referring to FIGS. 2 and 14, a plurality of buried contacts BC, a plurality of upper spacers 65, a plurality of buried contact holes BCH, a plurality of bit contact holes 72H and a plurality of peripheral contact holes 73H may be formed.

Each of the buried contacts BC may extend through the fourth insulating layer 63, the second insulating layer 39 and the first insulating layer 38 and, as such, may contact a corresponding one of the plurality of cell source/drain regions 35. Upper surfaces of the plurality of buried contacts BC may be formed at a lower level than the upper surfaces of the plurality of third capping patterns 55. The plurality of buried contacts BC may include or may be formed of a conductive material such as metal, metal silicide, metal nitride, metal oxide, polysilicon, conductive carbon, or a combination thereof. In an embodiment, the plurality of buried contacts BC may include or may be formed of a polysilicon layer.

The plurality of buried contact holes BCH may be formed on the plurality of buried contacts BC. The plurality of upper spacers 65 may be formed outside the plurality of inner spacers 57, the plurality of sacrificial spacers 59S and the plurality of outer spacers 61. Lower surfaces of the plurality of upper spacers 65 may contact the plurality of buried contacts BC. The plurality of upper spacers 65 and the plurality of buried contacts BC may be exposed in the plurality of buried contact holes BCH. The plurality of upper spacers 65 may include or may be formed of an insulating material such as silicon oxide, silicon nitride, silicon oxynitride, low-K dielectrics, high-K dielectrics, or a combination thereof. For example, the plurality of upper spacers 65 may include or may be formed of silicon nitride.

The plurality of bit contact holes 72H may be formed to extend through the plurality of third capping patterns 55, the plurality of second capping patterns 52 and the plurality of first capping patterns 49 in an area adjacent to the boundary between the cell area CA and the peripheral area PE, thereby exposing the plurality of first bit lines BL. The third bit conductive layer 45 may be exposed at bottoms of the plurality of bit contact holes 72H. The plurality of peripheral contact holes 73H may be formed to extend through the plurality of third capping patterns 55, the third insulating layer 53 and the plurality of second capping patterns 52, thereby exposing the plurality of peripheral source/drain regions 36.

Figure 15:
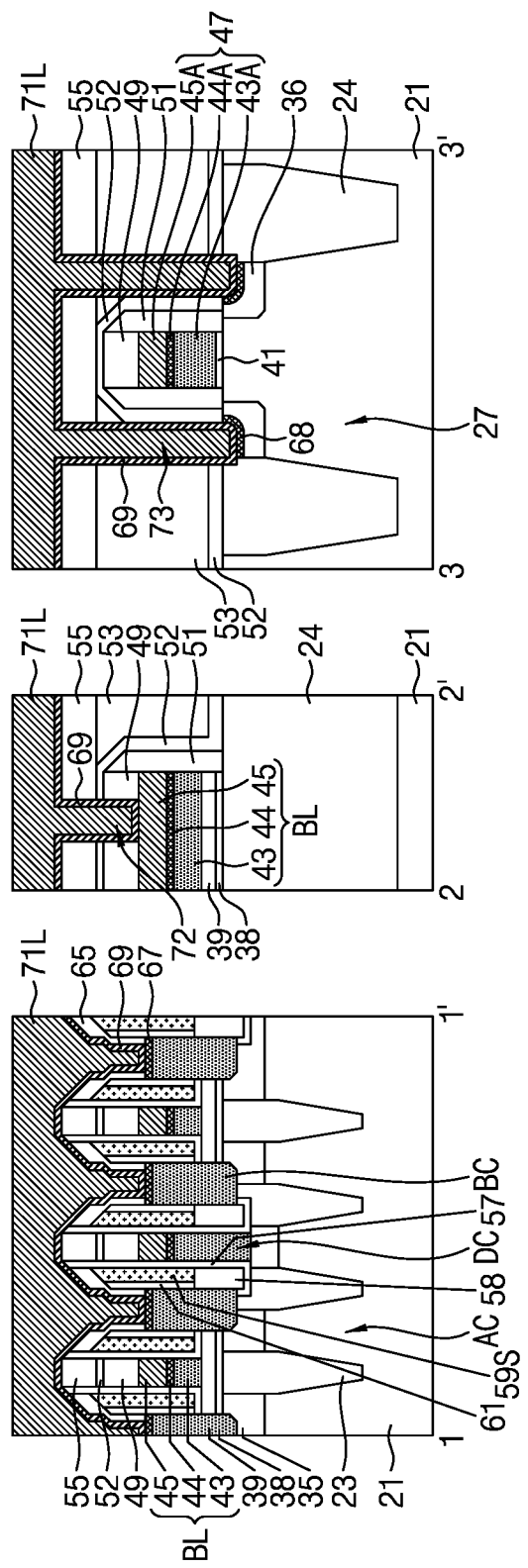

Referring to FIGS. 2 and 15, a plurality of first metal silicide layers 67 may be formed on the plurality of buried contacts BC exposed in the plurality of buried contact holes BCH, and a plurality of second metal silicide layers 68 may be formed on the plurality of peripheral source/drain regions 37 exposed in the plurality of peripheral contact holes 73H. In an embodiment, the plurality of first metal silicide layers 67 and the plurality of second metal silicide layers 68 may include or may be formed of CoSi, NiSi, TiSi, TaSi, or a combination thereof.

A barrier layer 69 and a conductive layer 71L may be sequentially stacked to fill the plurality of buried contact holes BCH, the plurality of bit contact holes 72H and the plurality of peripheral contact holes 73H while covering the substrate 21. The barrier layer 69 may include or may be formed of Ti, TiN, Ta, TaN, or a combination thereof. The conductive layer 71L may include W, WN, Ti, TiN, Ta, TaN, Ni, Co, Al, Ag, Pt, Au, Ru, Cr, Sn, or a combination thereof.

The conductive layer 71L in the plurality of bit contact holes 72H may constitute a plurality of bit contact plugs 72. The barrier layer 69 may surround side-walls and bottoms of the plurality of bit contact plugs 72. The barrier layer 69 may contact the third bit conductive layer 45.

The conductive layer 71L in the plurality of peripheral contact holes 73H may constitute a plurality of contact plugs 73. The barrier layer 69 may surround sidewalls and bottoms of the plurality of peripheral contact plugs 73. The barrier layer 69 may contact the plurality of second metal silicide layers 68.

Figure 16:
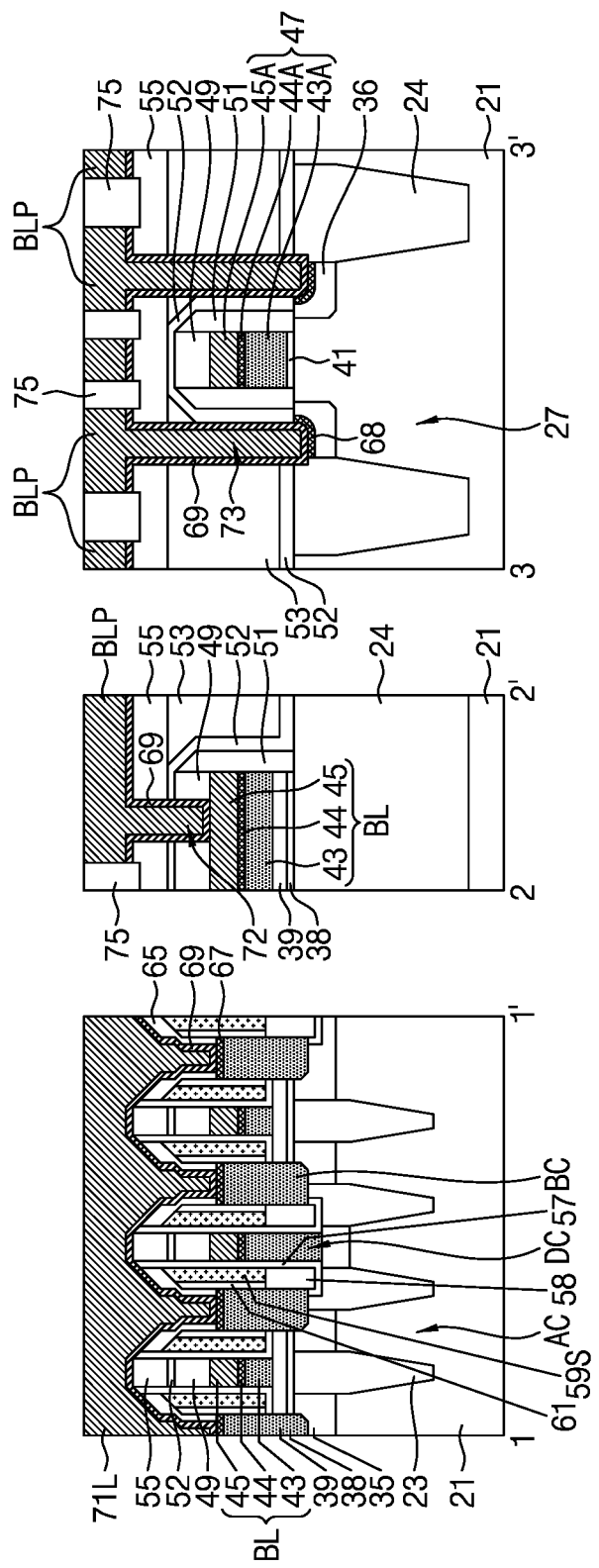

Referring to FIGS. 2 and 16, the conductive layer 71L at the peripheral area PE may be patterned to form a plurality of second bit lines BLP. After the formation of the plurality of second bit lines BLP, the barrier layer 69 may be preserved (i.e., remain) on lower surfaces of the plurality of second bit lines BLP. A plurality of first insulating patterns 75 may be formed in spaces among the plurality of second bit lines BLP. Upper surfaces of the plurality of second bit lines BLP and the plurality of first insulating patterns 75 may be formed to be substantially coplanar with each other, using a planarization process. The planarization process may include a chemical mechanical polishing (CMP) process, an etch-back process, or a combination thereof. Each of the plurality of bit contact plugs 72 and the plurality of peripheral contact plugs 73 may be in continuity with a lower portion of a corresponding one of the plurality of second bit lines BLP.

The plurality of first insulating patterns 75 may be a single layer or multiple layers. The plurality of first insulating patterns 75 may include or may be formed of an insulating material such as silicon oxide, silicon nitride, silicon oxynitride, low-K dielectrics, high-K dielectrics, or a combination thereof. For example, the plurality of first insulating patterns 75 may include or may be formed of silicon nitride.

Figure 17:
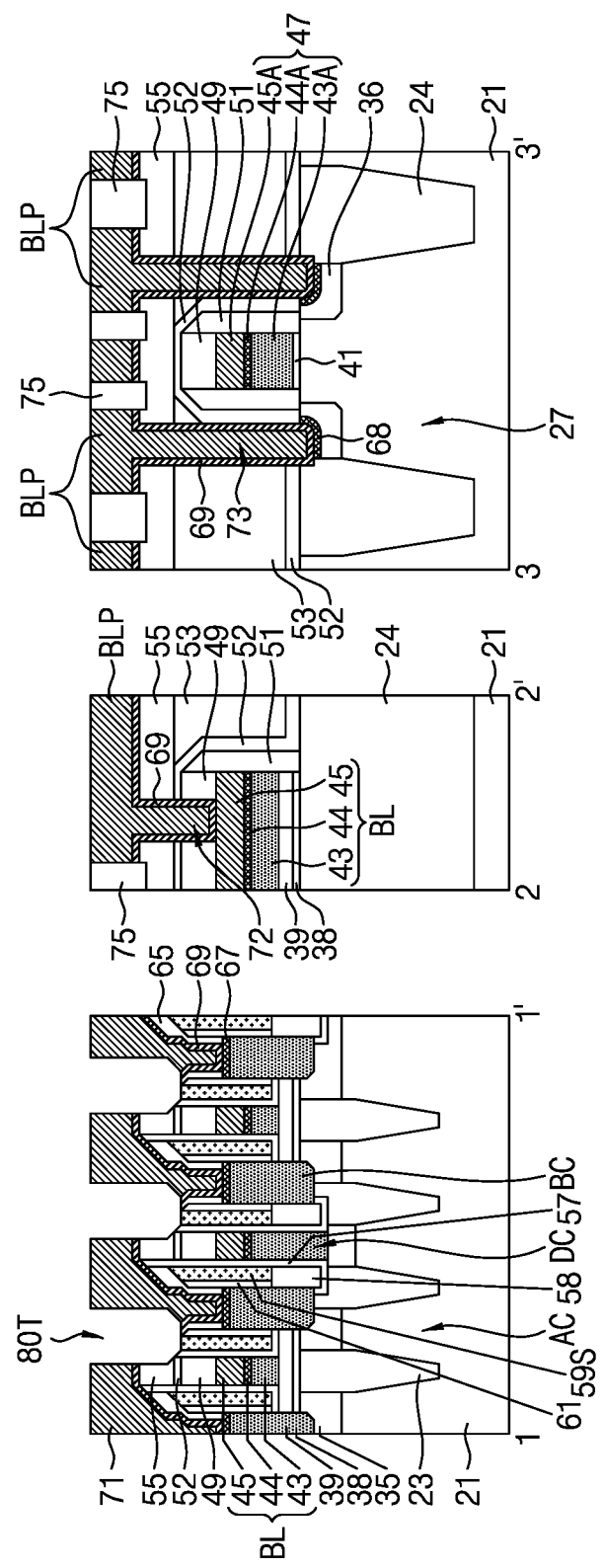

Referring to FIGS. 2 and 17, the conductive layer 71L at the cell area CA may be patterned to form a pad separation trench 80T defining a plurality of landing pads 71. After the formation of the pad separation trench 80T, the barrier layer 69 may be preserved (i.e., remain) on lower surfaces of the plurality of landing pads 71. The barrier layer 69 may contact the plurality of first metal silicide layers 67. The plurality of sacrificial spacers 59S may be exposed at a bottom of the pad separation trench 80T.

In an embodiment, the pad separation trench 80T may extend through portions of the conductive layer 71L, the barrier layer 69, the plurality of third capping patterns 55, the plurality of inner spacers 57, the plurality of sacrificial spacers 59S, the plurality of outer spacers 61 and the plurality of upper spacers 65. Side surfaces of the plurality of third capping patterns 55 may be exposed at sidewalls of the pad separation trench 80T. The plurality of inner spacers 57, the plurality of sacrificial spacers 59S, the plurality of outer spacers 61 and the plurality of upper spacers 65 may be exposed at the bottom of the pad separation trench 80T.

Figure 18:
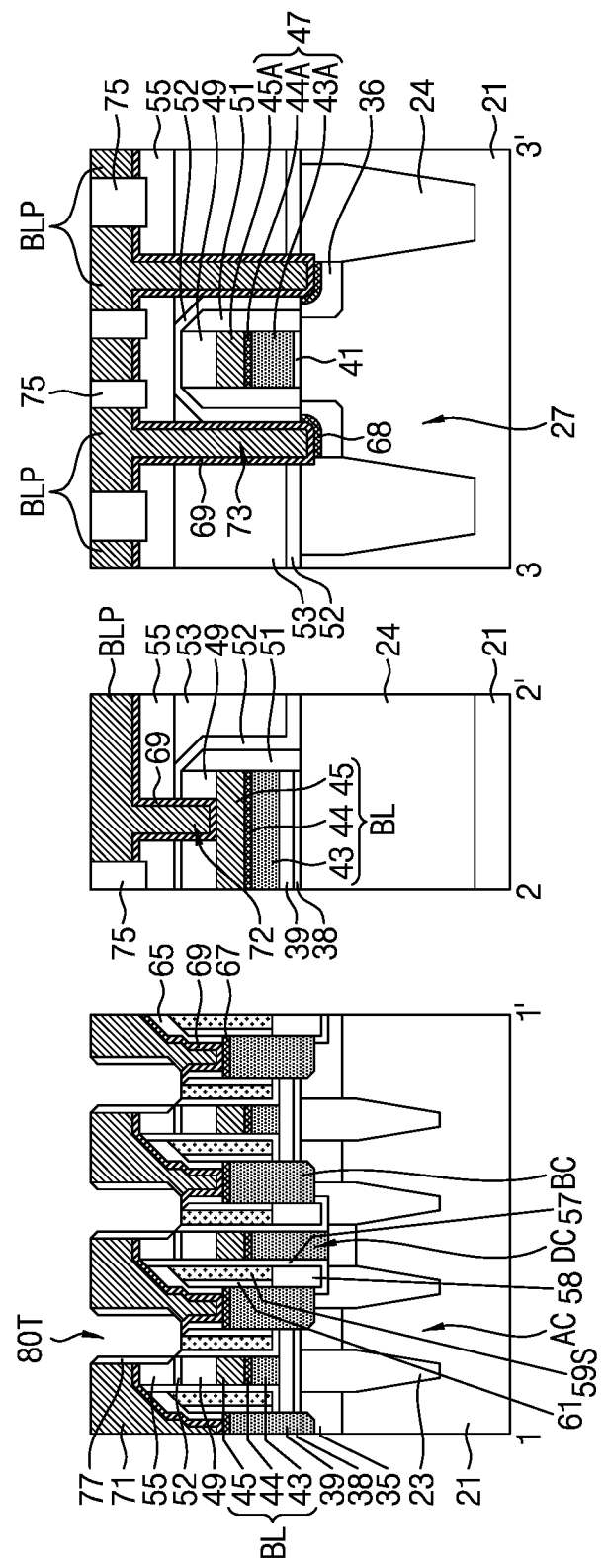

Referring to FIGS. 2 and 18, a pad spacer layer 77 may be formed on each sidewall of the pad separation trench 80T. The pad spacer layer 77 may include or may be formed of an insulating material such as silicon oxide, silicon nitride, silicon oxynitride, low-K dielectrics, high-K dielectrics, or a combination thereof. For example, the pad spacer layer 77 may include or may be formed of silicon nitride. The plurality of sacrificial spacers 59S may be exposed at the bottom of the pad separation trench 80T.

Figure 19:
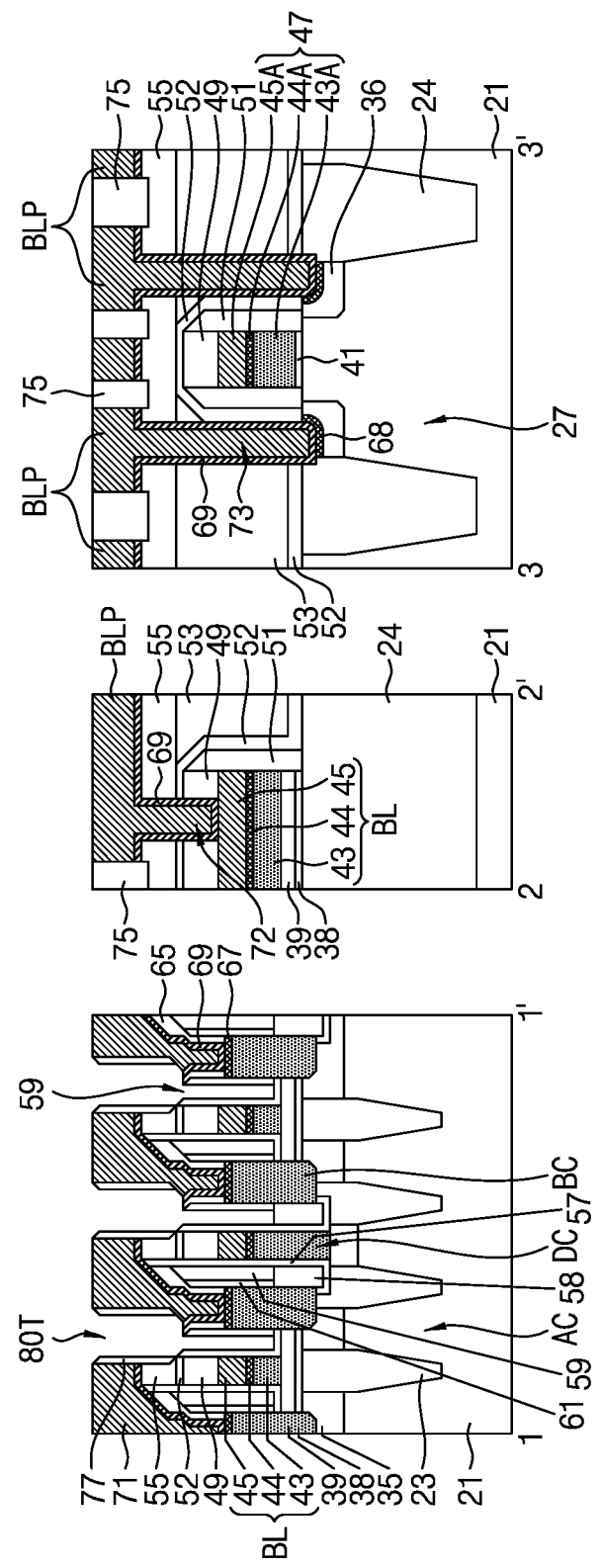

Referring to FIGS. 2 and 19, the plurality of sacrificial spacers 59S may be removed to form a plurality of air gaps 59. The plurality of air gaps 59 may be formed between the plurality of inner spacers 57 and the plurality of outer spacers 61. The plurality of air gaps 59 may be disposed in spaces among the plurality of first bit lines BL. The plurality of air gaps 59 may be disposed in spaces between the plurality of first bit lines BL and the plurality of buried contacts BC.

Figure 20:
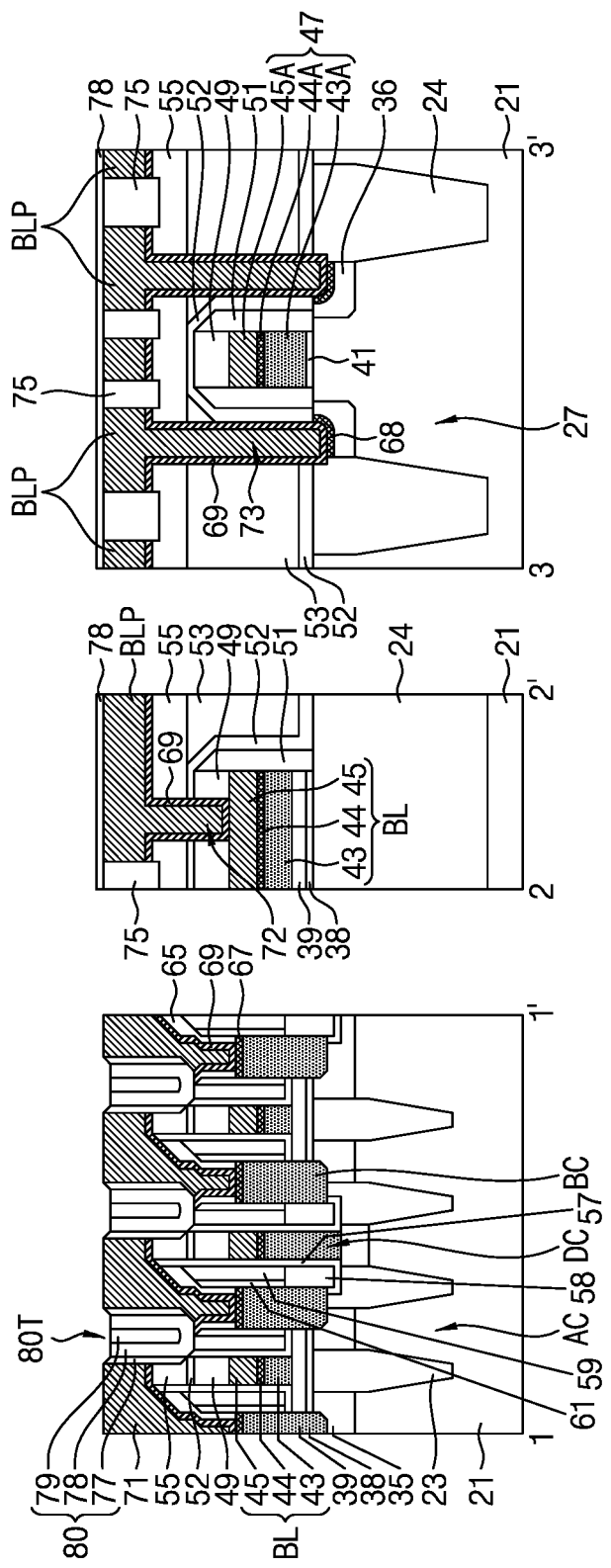

Referring to FIGS. 2 and 20, a spacer capping layer 78 and a filling layer 79 may be sequentially stacked to fill the pad separation trench 80T. Formation of the spacer capping layer 78 and the filling layer 79 may include a plurality of thin film formation processes and a planarization process. The planarization process may include a chemical mechanical polishing (CMP) process, an etch-back process, or a combination thereof. The pad spacer layer 77, the spacer capping layer 78 and the filling layer 79, which fill the pad separation trench 80T, may constitute a plurality of second insulating patterns 80.

During formation of the plurality of second insulating patterns 80, the spacer capping layer 78 may be preserved (i.e., remain) on the plurality of second bit lines BLP and the plurality of first insulating patterns 75. In an embodiment, during formation of the plurality of second insulating patterns 80, the spacer capping layer 78 on the plurality of second bit lines BLP and the plurality of first insulating patterns 75 may be completely removed.

The spacer capping layer 78 and the filling layer 79 may include or may be formed of an insulating material such as silicon oxide, silicon nitride, silicon oxynitride, low-K dielectrics, high-K dielectrics, or a combination thereof. In an embodiment, the spacer capping layer 78 may include or is formed of a material different from that of the filling layer 79. For example, the spacer capping layer 78 may include or may be formed of SiCN, whereas the filling layer 79 may include or may be formed of silicon nitride or the filling layer 79 and the pad spacer layer 77 may include or may be formed of silicon nitride.

Figure 21:
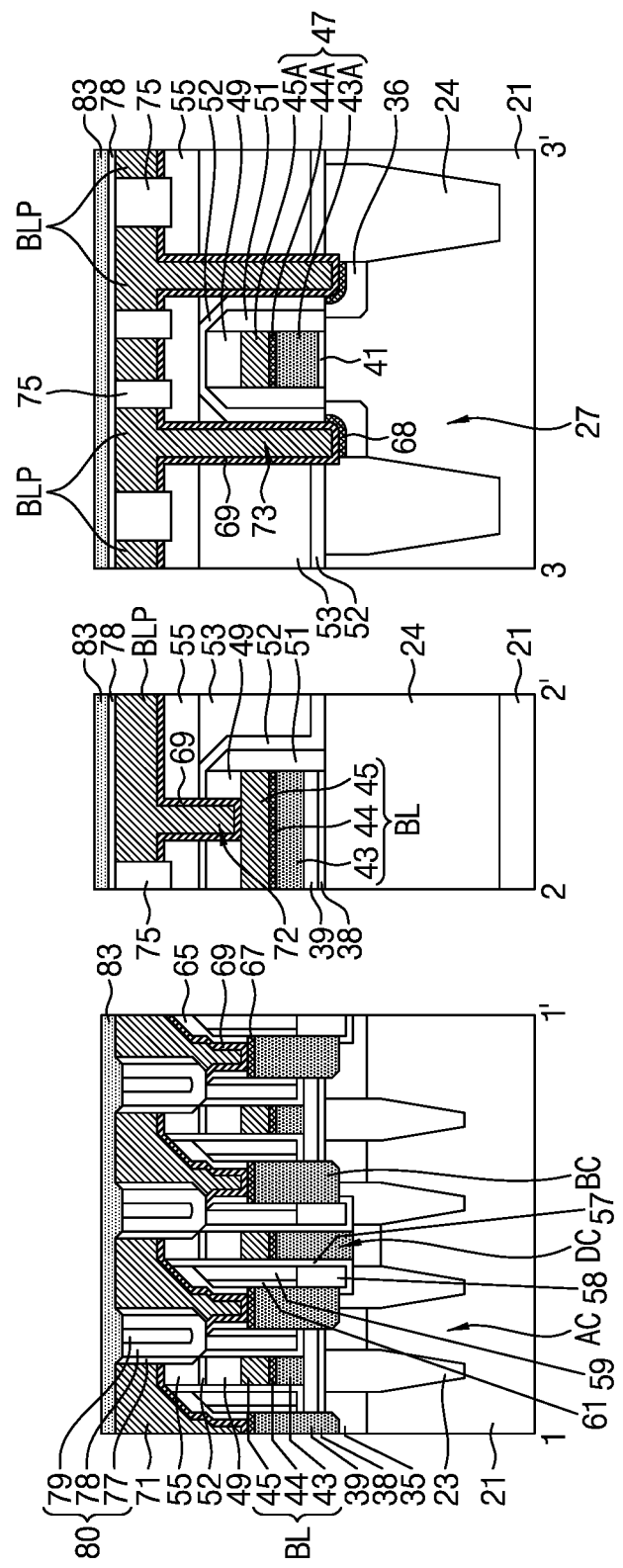

Referring to FIGS. 2 and 21, an etch stop layer 83 may be formed on the plurality of landing pads 71, the plurality of second insulating patterns 80 and the spacer capping layer 78. In an embodiment the etch stop layer 83 may include silicon nitride.

Referring to FIGS. 1 and 2, a plurality of cell capacitors 95 may be formed on the plurality of landing pads 71. The plurality of cell capacitors 95 may include a plurality of lower electrodes ST, a capacitor dielectric layer 92, and an upper electrode 93. A fifth insulating layer 99 may be formed on the etch stop layer 83 at the peripheral area PE.

Each of the plurality of lower electrodes ST may extend through the etch stop layer 83 and, as such, may contact a corresponding one of the plurality of landing pads 71. A supporter 97 may be formed in spaces among the plurality of lower electrodes ST. For example, the supporter 97 may extend parallel to a bottom surface of the substrate 21 between a pair of two lower electrodes ST adjacent to each other. The supporter 97 may connect two facing sidewalls of the pair to each other to hold the pair in place in a fabrication process. The capacitor dielectric layer 92 may be formed on the plurality of lower electrodes ST. The upper electrode 93 may be formed on the capacitor dielectric layer 92. The capacitor dielectric layer 92 may extend between the supporter 97 and the upper electrode 93. Each of the plurality of lower electrodes ST may include a pillar shape, a cylindrical shape, a screw shape, a box shape, a flat plate shape, an ameba shape, or a combination thereof.

Each of the plurality of lower electrodes ST and the upper electrode 93 may include or may be formed of a conductive material such as metal, metal silicide, metal nitride, metal oxide, polysilicon, conductive carbon, or a combination thereof. Each of the plurality of lower electrodes ST and the upper electrode 93 may include or may be formed of W, WN, Ti, TiN, Ta, TaN, Ni, Co, Al, Ag, Pt, Au, Ru, Cr, Sn, or a combination thereof.

Each of the capacitor dielectric layer 92, the supporter 97 and the fifth insulating layer 99 may include or may be formed of an insulating material such as silicon oxide, silicon nitride, silicon oxynitride, low-K dielectrics, high-K dielectrics, or a combination thereof. Each of the capacitor dielectric layer 92, the supporter 97 and the fifth insulating layer 99 may be a single layer or multiple layers. In an embodiment, the capacitor dielectric layer 92 may include or may be formed of a high-K dielectric layer such as a metal oxide layer or a metal silicate layer, the supporter 97 may include or may be formed of a silicon nitride layer, and the fifth insulating layer 99 may include or may be formed of a silicon oxide layer.

Figure 22:
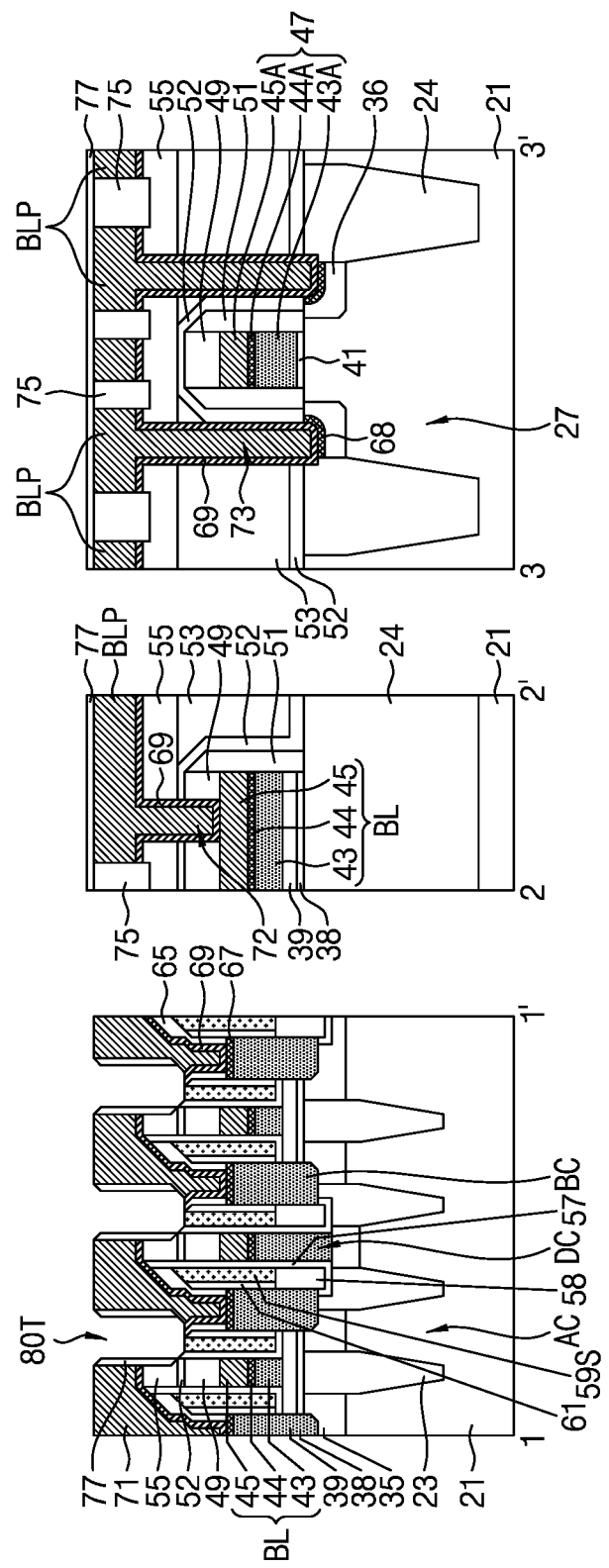
Figure 23:
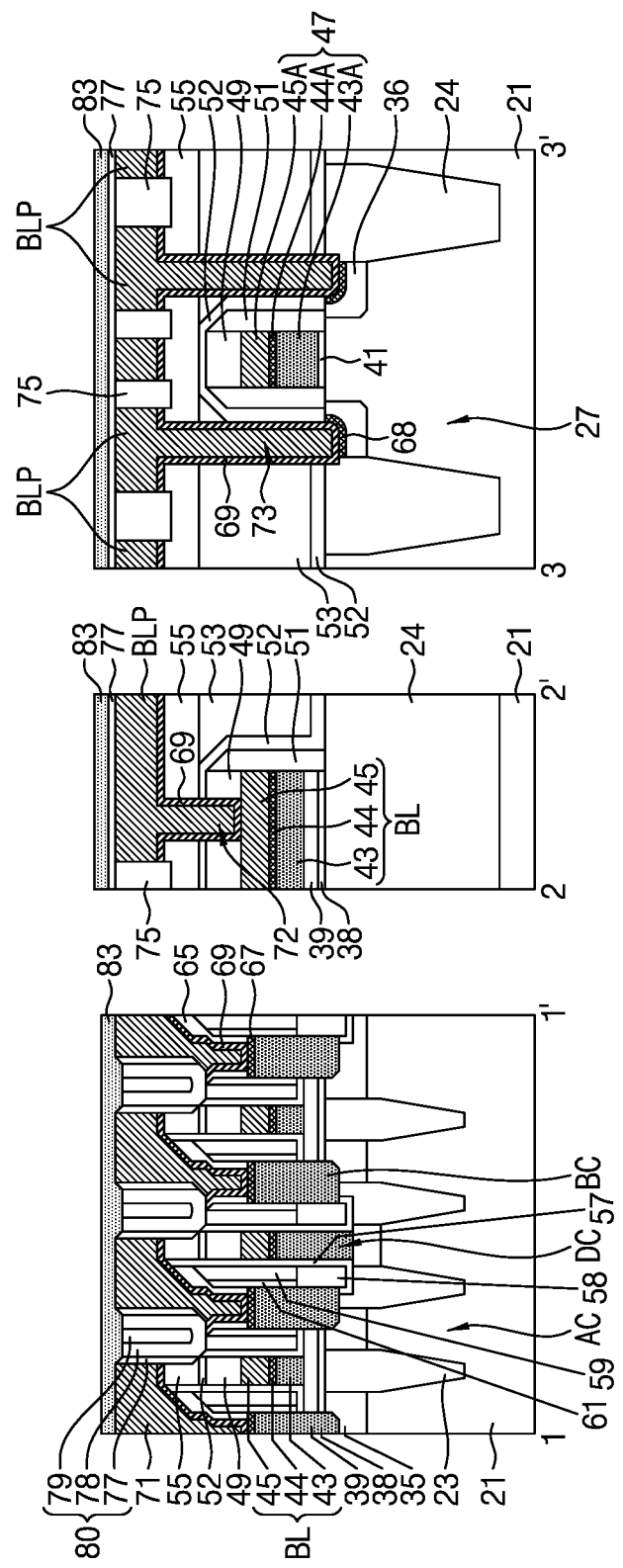

FIGS. 22 and 23 are cross-sectional views taken along lines 1-1', 2-2' and 3-3' in FIG. 2 in order to explain semiconductor device formation methods according to exemplary embodiments of the disclosure.

Referring to FIGS. 2 and 22, a pad spacer layer 77 may be formed on sidewalls of a pad separation trench 80T. Formation of the pad spacer layer 77 may include a thin film formation process and an anisotropic etching process. In an embodiment, after the formation of the pad separation trench 80T, the pad spacer layer 77 may be preserved (i.e., remain) on a plurality of second bit lines BLP and a plurality of first insulating patterns 75.

Referring to FIGS. 2 and 23, a spacer capping layer 78 and a filling layer 79 may be sequentially stacked to fill the pad separation trench 80T. The pad spacer layer 77, the spacer capping layer 78 and the filling layer 79, which fill the pad separation trench 80T, may constitute a plurality of second insulating patterns 80. An etch stop layer 83 may be formed on the plurality of landing pads 71, the plurality of second insulating patterns 80 and the pad spacer layer 77.

Referring to FIGS. 2 and 5, a plurality of cell capacitors 95 may be formed on the plurality of landing pads 71. The plurality of cell capacitors 95 may include a plurality of lower electrodes ST, a capacitor dielectric layer 92, and an upper electrode 93. A fifth insulating layer 99 may be formed on the etch stop layer 83 at the peripheral area PE.

Figure 24:
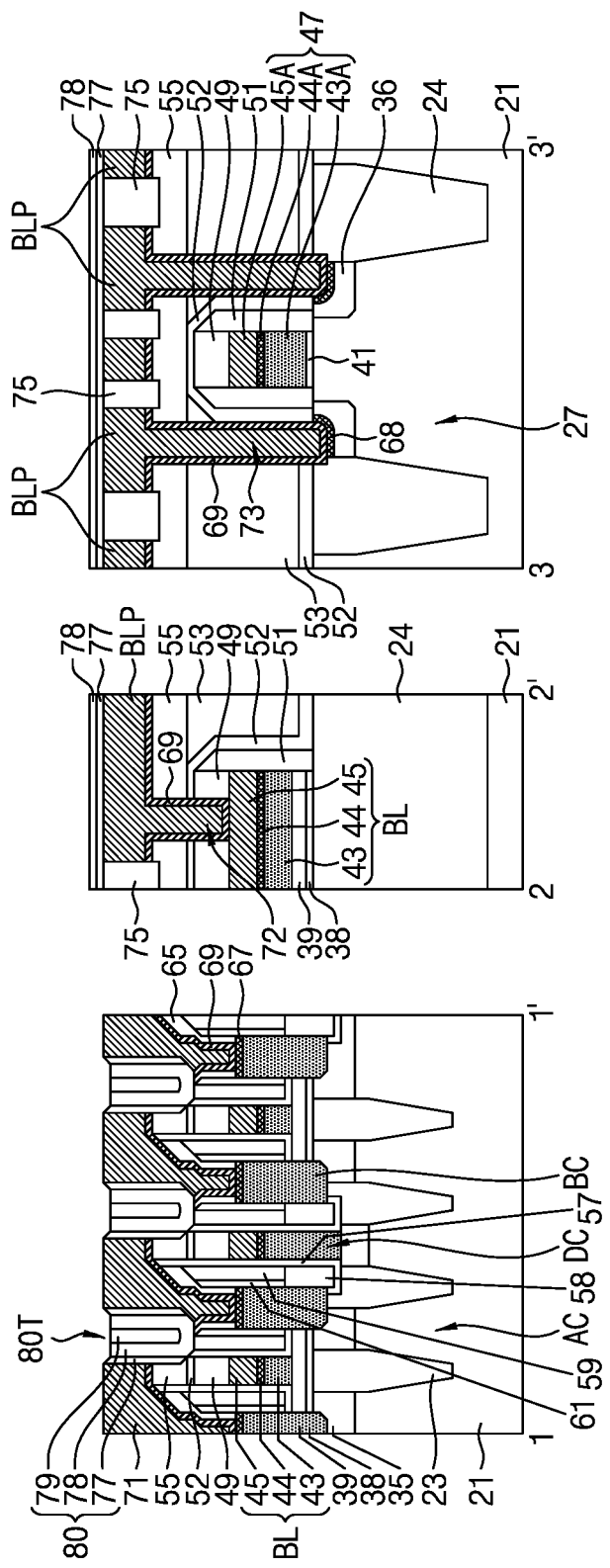
Figure 25:
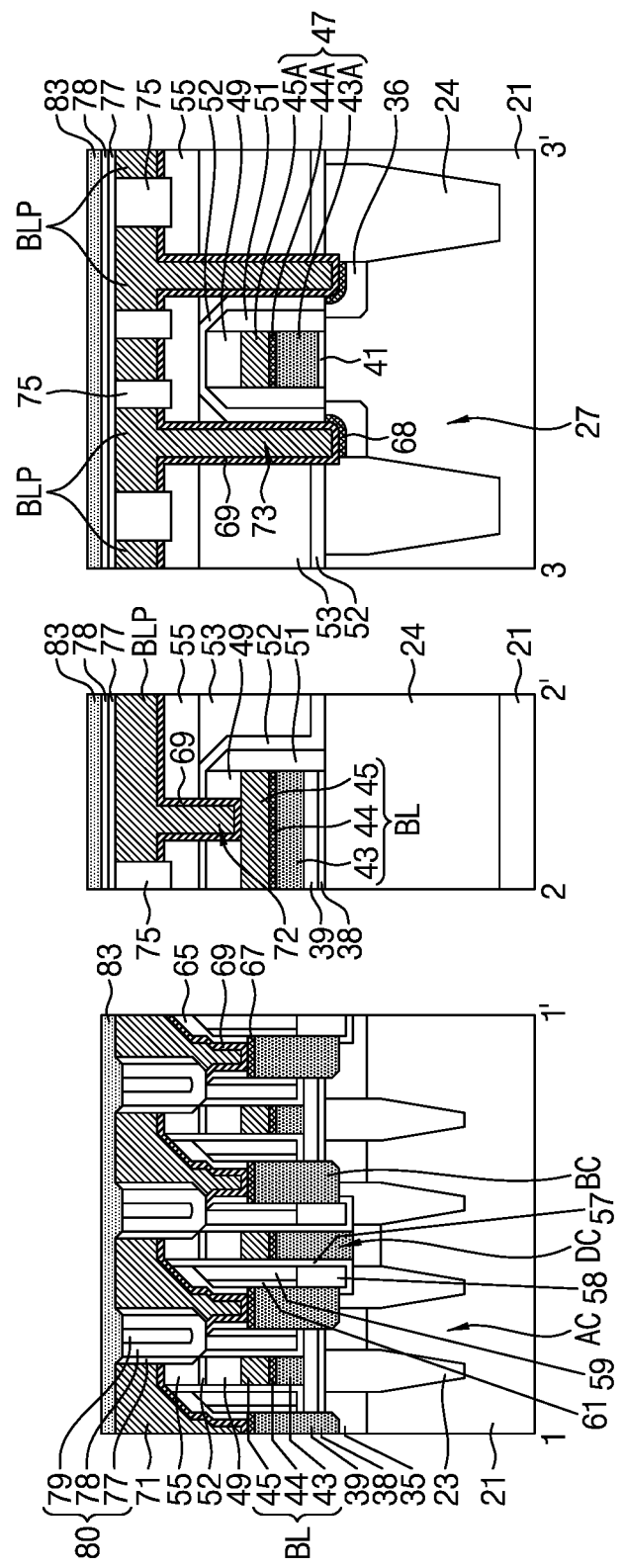

FIGS. 24 and 25 are cross-sectional views taken along lines 1-1', 2-2' and 3-3' in FIG. 2 in order to explain semiconductor device formation methods according to exemplary embodiments of the disclosure.

Referring to FIGS. 2 and 24, each of a plurality of second insulating patterns 80 may include a pad spacer layer 77, a spacer capping layer 78, and a filling layer 79. In an embodiment, the pad spacer layer 77 and the spacer capping layer 78 may be sequentially stacked on a plurality of second bit lines BLP and a plurality of first insulating patterns 75.

Referring to FIGS. 2 and 25, an etch stop layer 83 may be formed on a plurality of landing pads 71, the plurality of second insulating patterns 80 and the spacer capping layer 78.

Referring to FIGS. 2 and 6, a plurality of cell capacitors 95 may be formed on the plurality of landing pads 71. The plurality of cell capacitors 95 may include a plurality of lower electrodes ST, a capacitor dielectric layer 92, and an upper electrode 93. A fifth insulating layer 99 may be formed on the etch stop layer 83 at the peripheral area PE.

Figure 26:
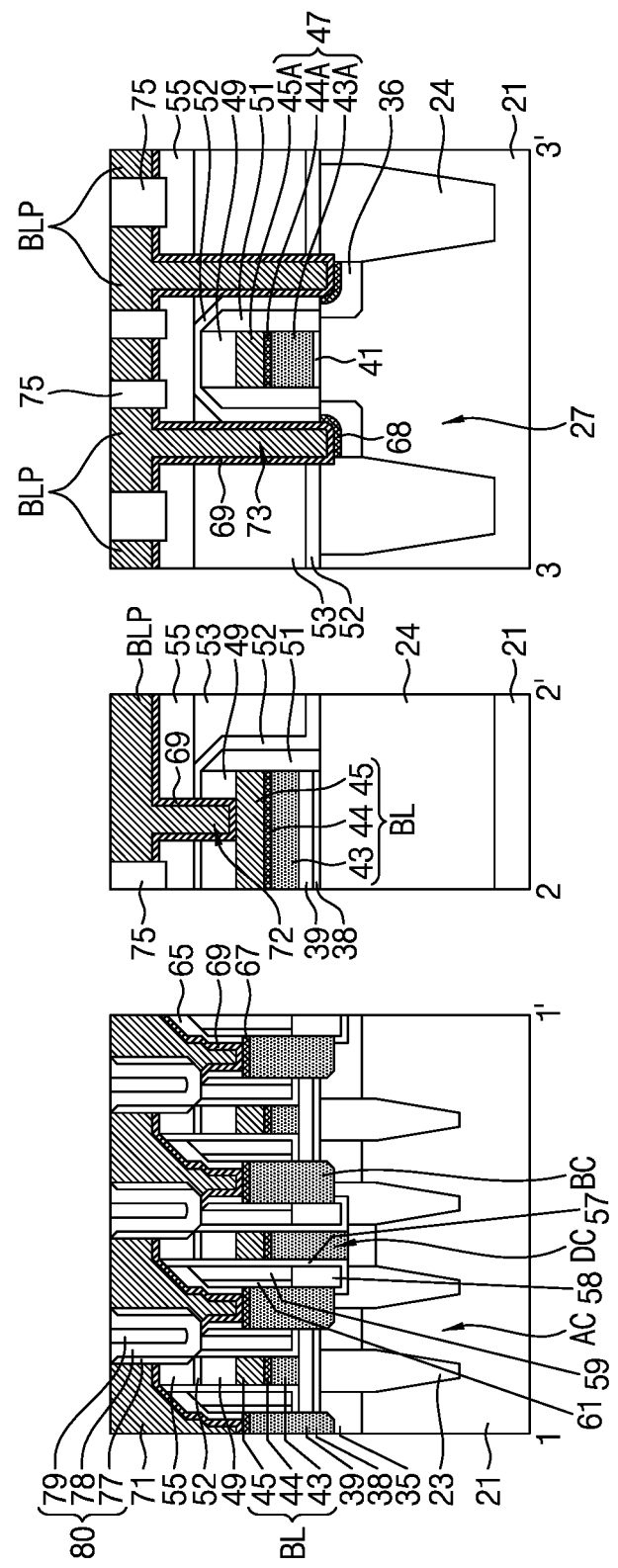
Figure 27:
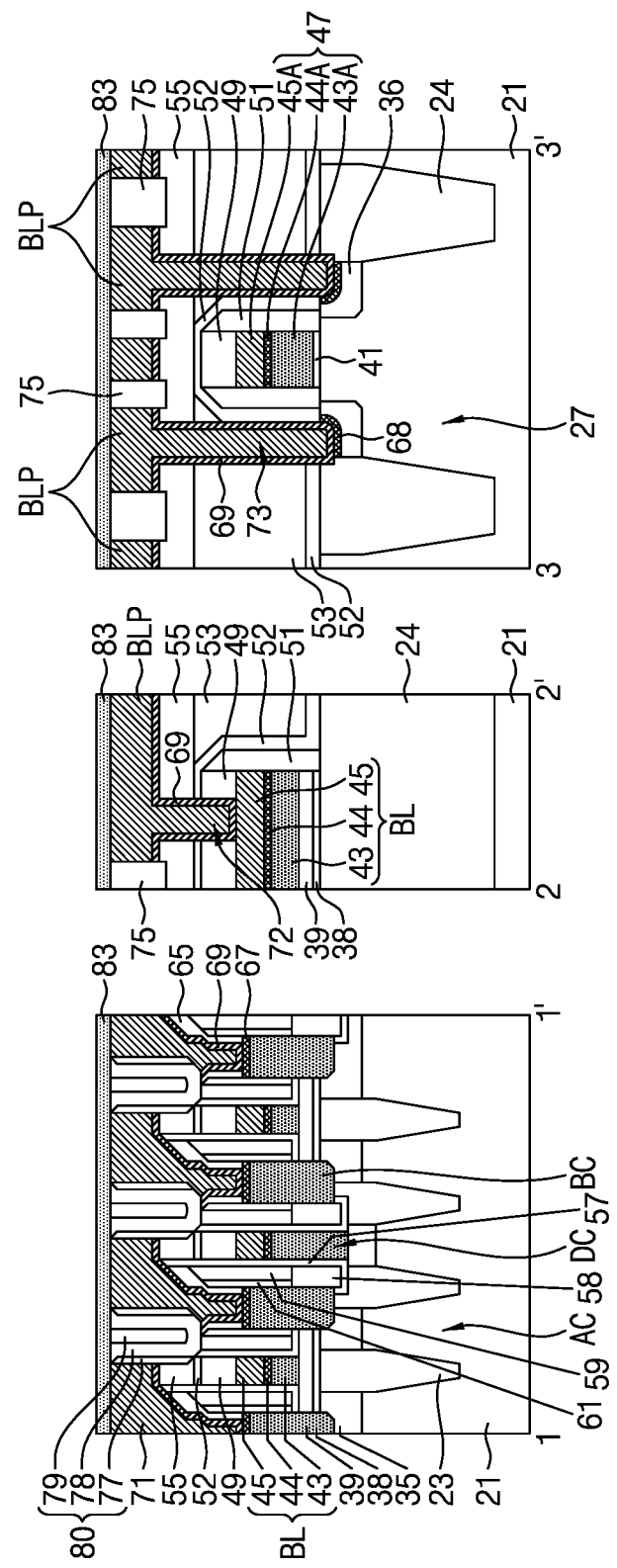

FIGS. 26 and 27 are cross-sectional views taken along lines 1-1', 2-2' and 3-3' in FIG. 2 in order to explain semiconductor device formation methods according to exemplary embodiments of the disclosure.

Referring to FIGS. 2 and 26, upper surfaces of a plurality of landing pads 71, a plurality of second bit lines BLP, a plurality of first insulating patterns 75 and a plurality of second insulating patterns 80 may be substantially coplanar with each other.

Referring to FIGS. 2 and 27, an etch stop layer 83 may be formed on the plurality of landing pads 71, the plurality of second bit lines BLP, the plurality of first insulating patterns 75 and the plurality of second insulating patterns 80. The etch stop layer 83 may contact upper surfaces of the plurality of landing pads 71, the plurality of second bit lines BLP, the plurality of first insulating patterns 75 and the plurality of second insulating patterns 80.

Referring to FIGS. 2 and 7, a plurality of cell capacitors 95 may be formed on the plurality of landing pads 71. The plurality of cell capacitors 95 may include a plurality of lower electrodes ST, a capacitor dielectric layer 92, and an upper electrode 93. A fifth insulating layer 99 may be formed on the etch stop layer 83 at the peripheral area PE.

Figure 28:
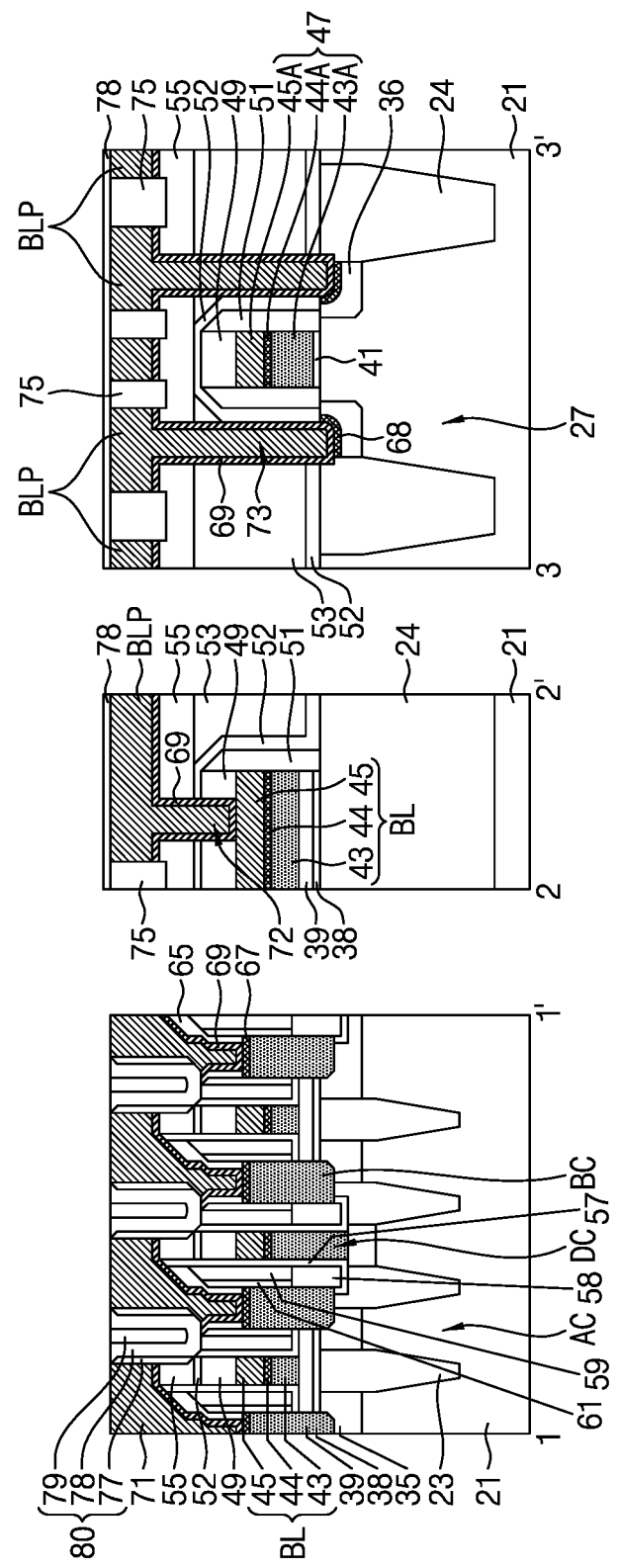
Figure 29:
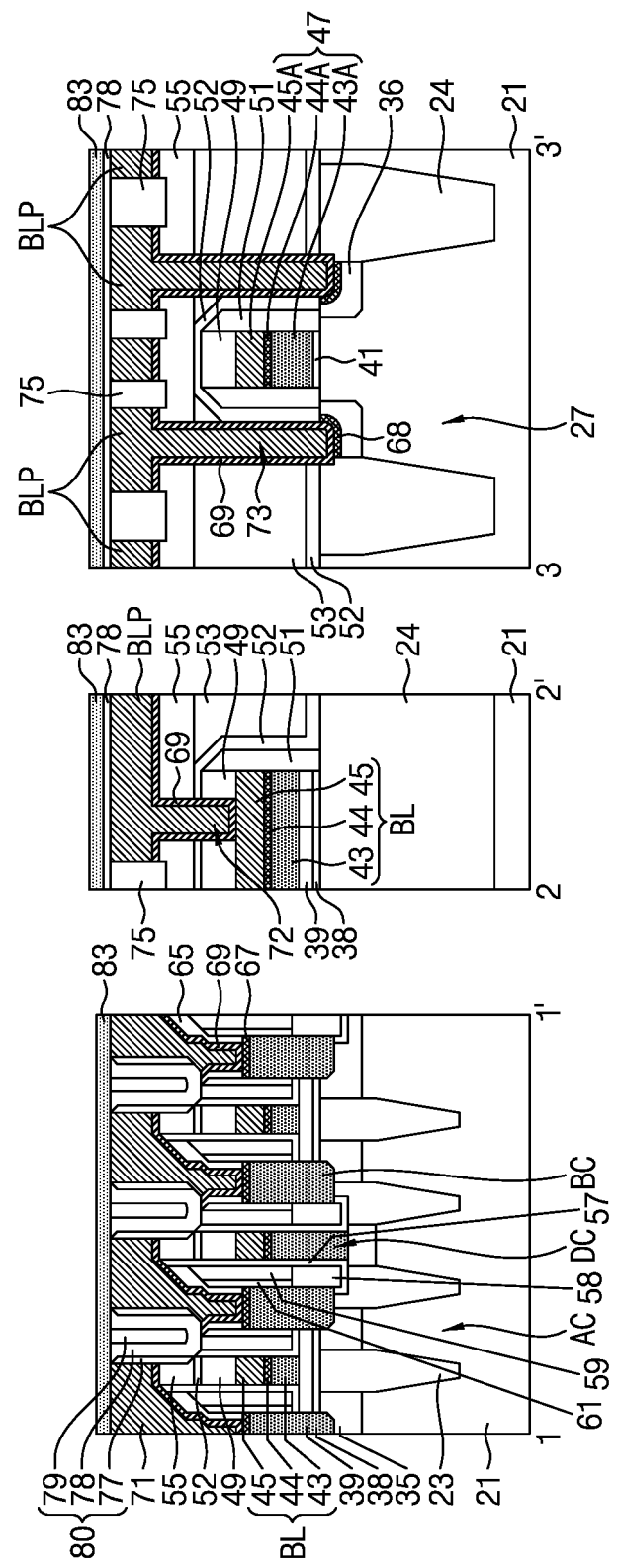

FIGS. 28 and 29 are cross-sectional views taken along lines 1-1', 2-2' and 3-3' in FIG. 2 in order to explain semiconductor device formation methods according to exemplary embodiments of the disclosure.

Referring to FIGS. 2 and 28, upper surfaces of a plurality of landing pads 71, a plurality of second bit lines BLP, a plurality of first insulating patterns 75 and a plurality of second insulating patterns 80 may be substantially coplanar with each other. The etch stop layer 83 may be removed. In an embodiment, after the removal of the etch stop layer 83, a spacer capping layer 78 may be preserved (i.e., remain) on the plurality of second bit lines BLP and the plurality of first insulating patterns 75.

Referring to FIGS. 2 and 29, an etch stop layer 83 may be formed on the plurality of landing pads 71, the plurality of second insulating patterns 80 and the spacer capping layer 78.

Referring to FIGS. 2 and 8, a plurality of cell capacitors 95 may be formed on the plurality of landing pads 71. A fifth insulating layer 99 may be formed on the etch stop layer 83 at the peripheral area PE.

Figure 30:
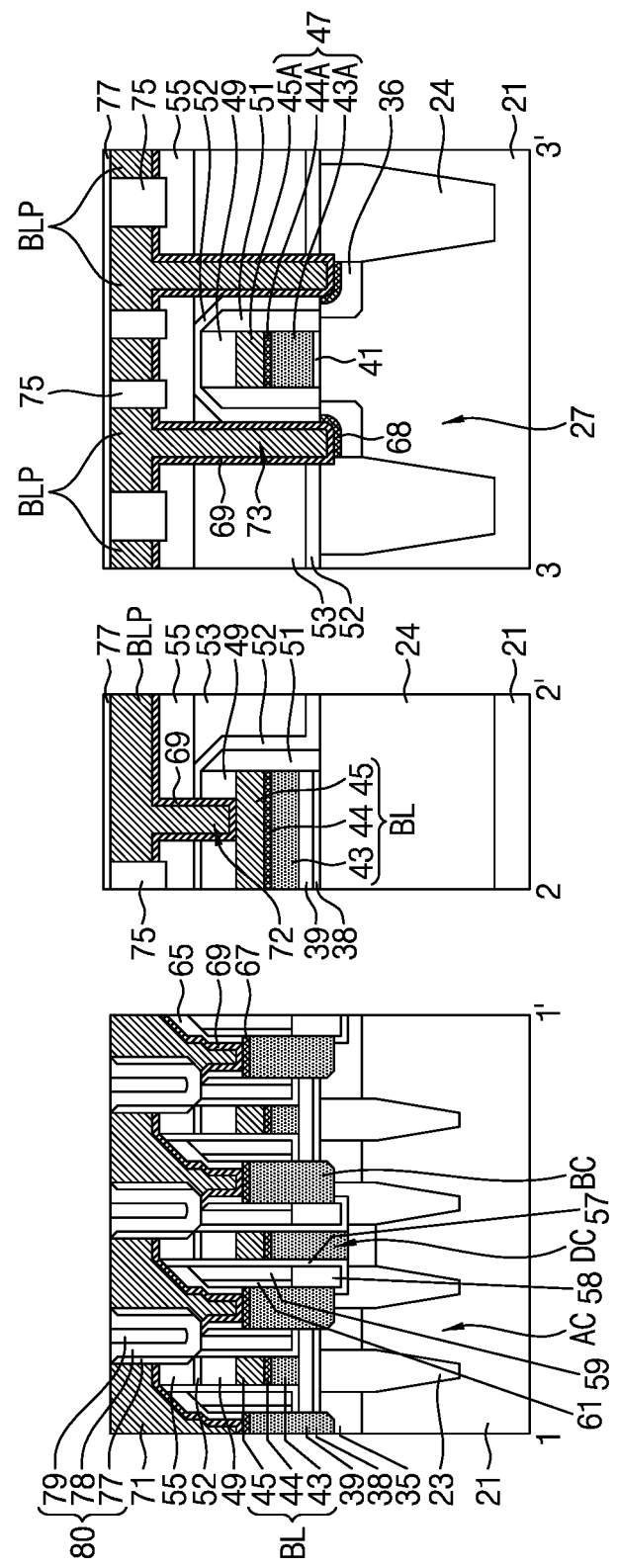
Figure 31:
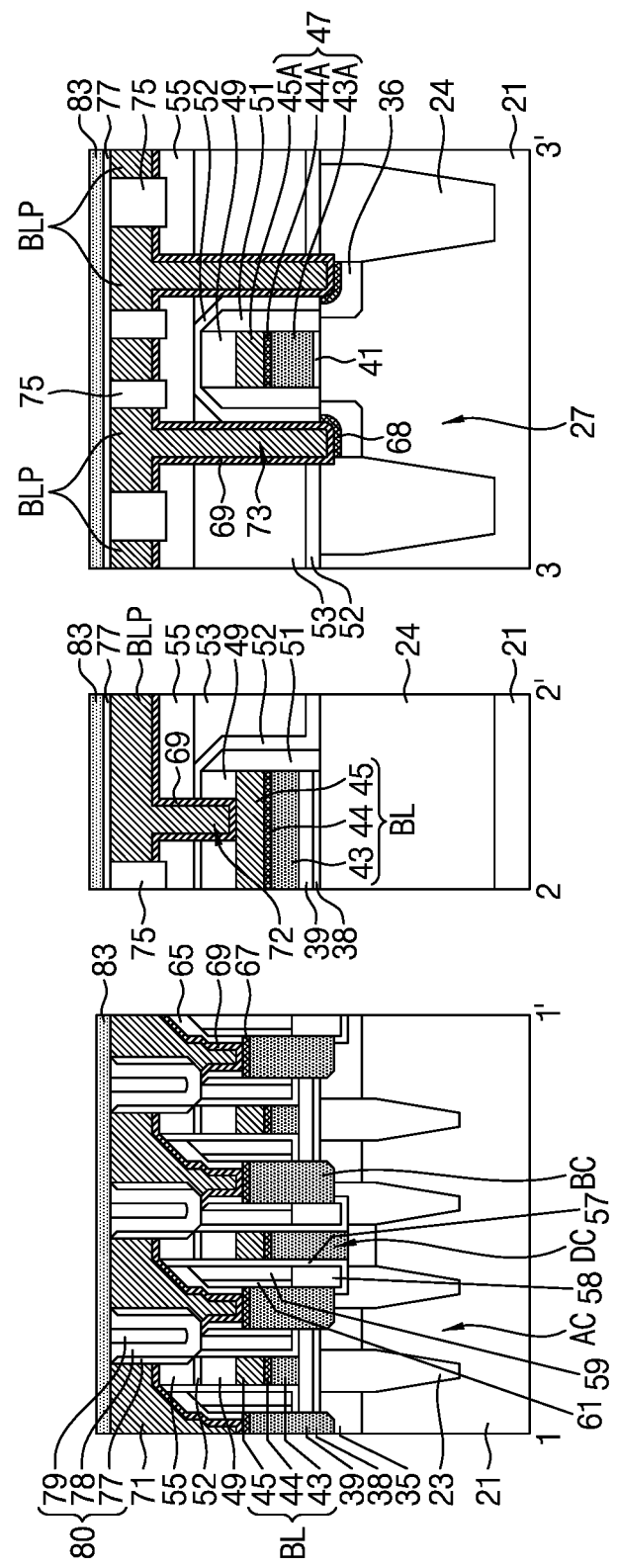

FIGS. 30 and 31 are cross-sectional views taken along lines 1-1', 2-2' and 3-3' in FIG. 2 in order to explain semiconductor device formation methods according to exemplary embodiments of the disclosure.

Referring to FIGS. 2 and 30, upper surfaces of a plurality of landing pads 71, a plurality of second bit lines BLP, a plurality of first insulating patterns 75 and a plurality of second insulating patterns 80 may be substantially coplanar with each other. In an embodiment, after the formation of the plurality of second insulating patterns 80, a pad spacer layer 77 may be preserved (i.e., remain) on the plurality of second bit lines BLP and the plurality of first insulating patterns 75.

Referring to FIGS. 2 and 31, an etch stop layer 83 may be formed on the plurality of landing pads 71, the plurality of second insulating patterns 80 and the pad spacer layer 77.

Referring to FIGS. 2 and 9, a plurality of cell capacitors 95 may be formed on the plurality of landing pads 71. A fifth insulating layer 99 may be formed on the etch stop layer 83 at the peripheral area PE.

FIGS. 32 to 36 are cross-sectional views taken along lines 1-1', 2-2' and 3-3' in FIG. 2 in order to explain semiconductor device formation methods according to exemplary embodiments of the disclosure.

Figure 32:
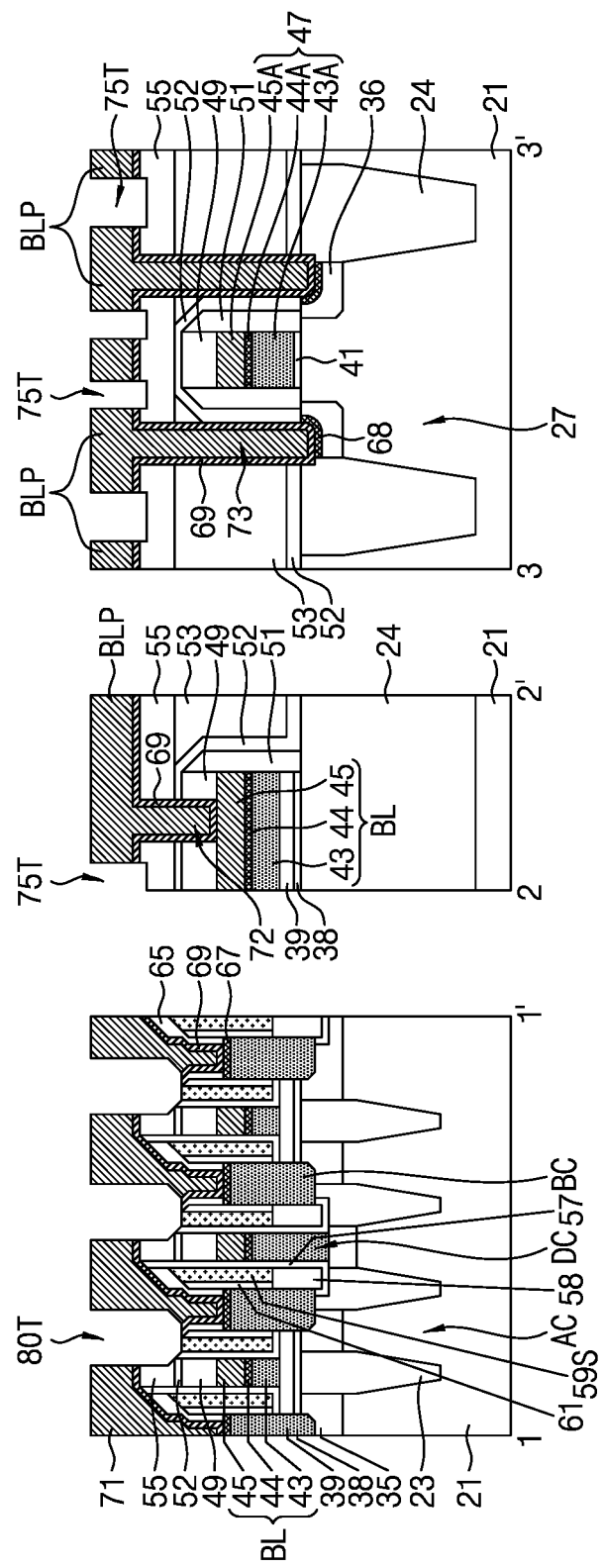

Referring to FIGS. 2 and 32, a pad separation trench 80T defining a plurality of landing pads 71 and a plurality of bit separation trenches 75T defining a plurality of second bit lines BLP may be formed.

Figure 33:
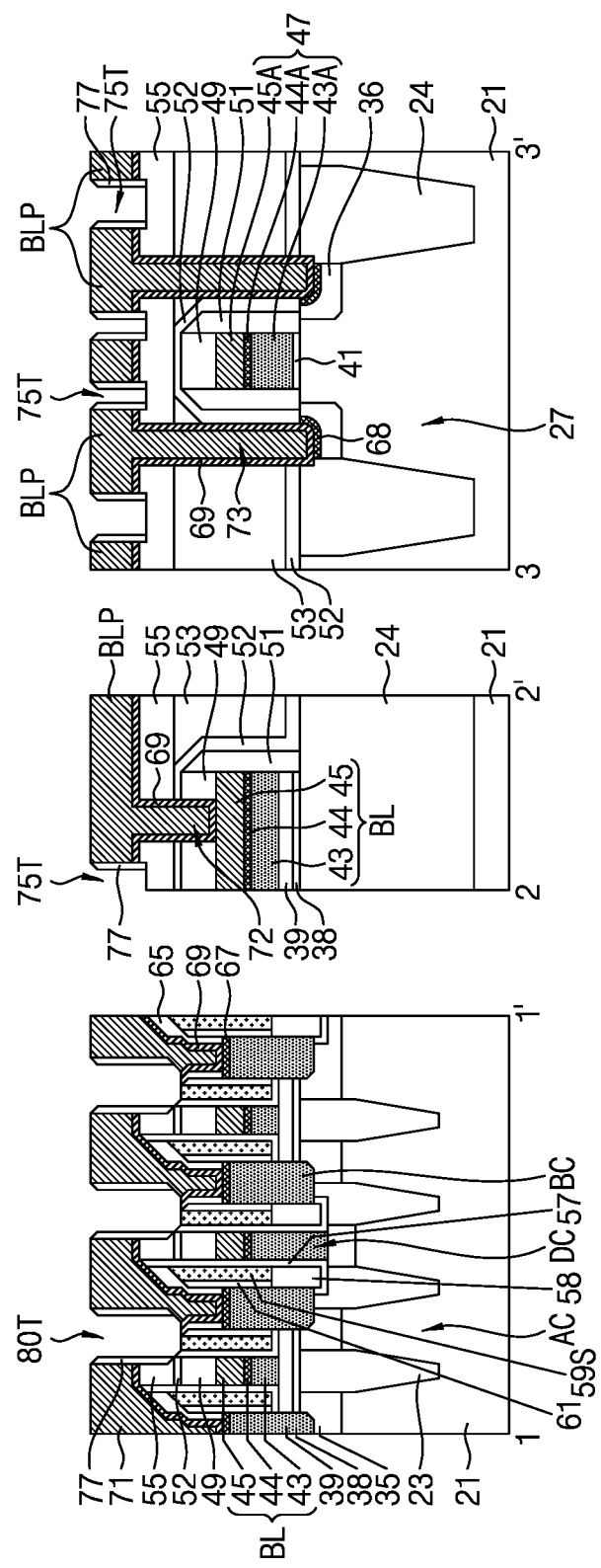

Referring to FIGS. 2 and 33, a pad spacer layer 77 may be formed on sidewalls of the pad separation trench 80T and the plurality of bit separation trenches 75T.

Figure 34:
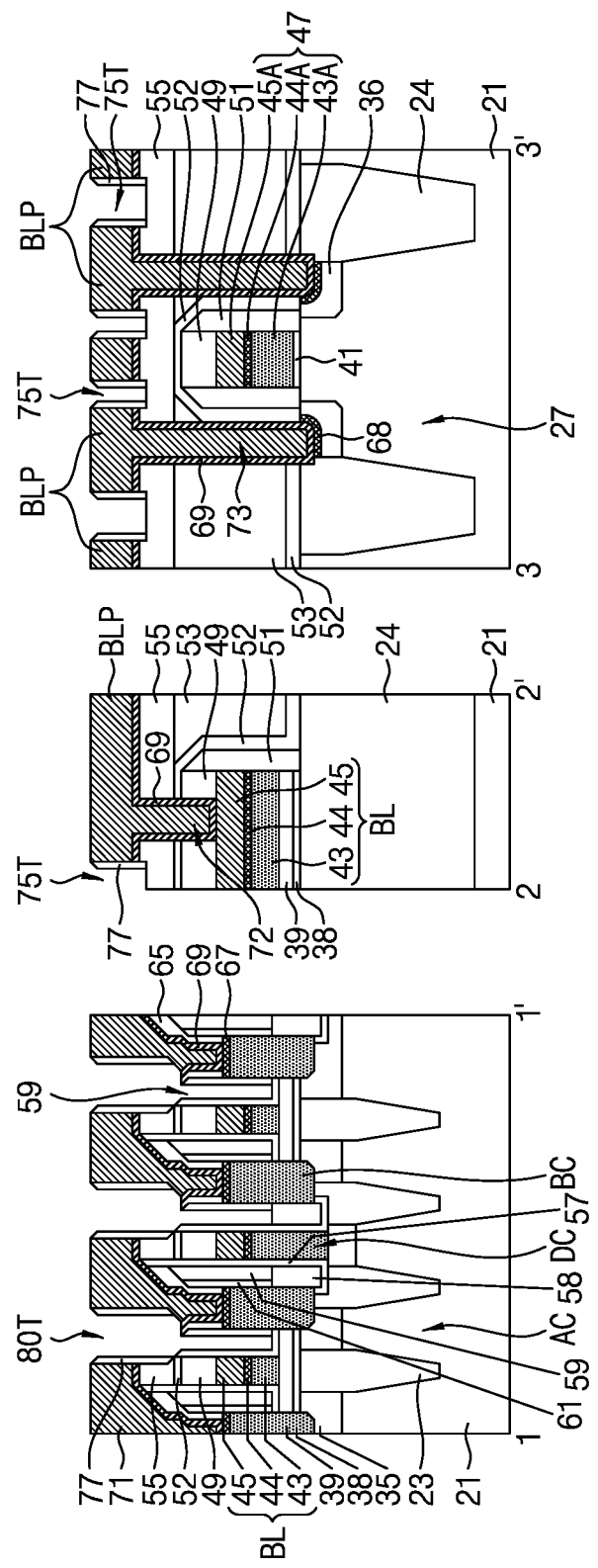

Referring to FIGS. 2 and 34, a plurality of sacrificial spacers 59S may be removed to form a plurality of air gaps 59.

Figure 35:
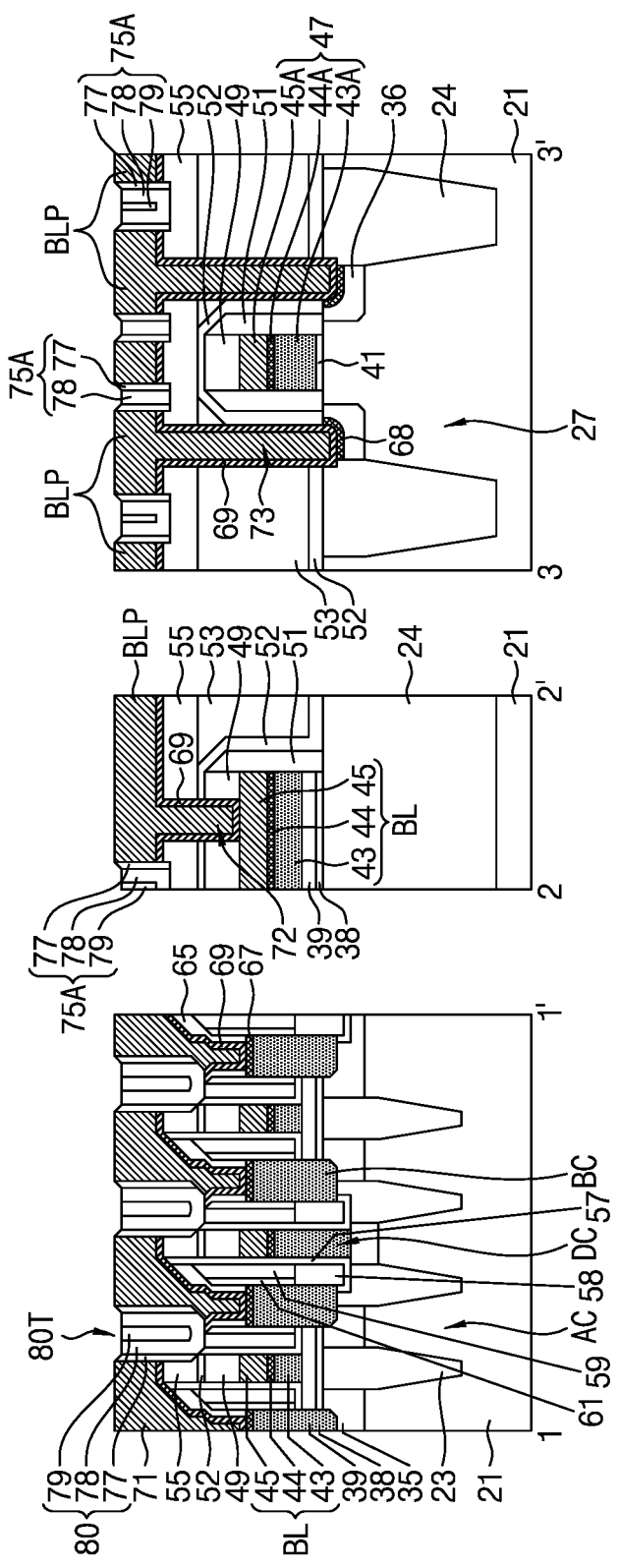

Referring to FIGS. 2 and 35, a spacer capping layer 78 and a filling layer 79 may be sequentially stacked to fill the pad separation trench 80T and the plurality of bit separation trenches 75T. The pad spacer layer 77, the spacer capping layer 78 and the filling layer 79, which fill the pad separation trench 80T, may constitute a plurality of second insulating patterns 80.

The pad spacer layer 77, the spacer capping layer 78 and the filling layer 79, which fill the plurality of bit separation trenches 75T, may constitute a plurality of first insulating patterns 75A. Some of the plurality of first insulating patterns 75A may include or may be formed of all of the pad spacer layer 77, the spacer capping layer 78 and the filling layer 79. The others of the plurality of first insulating patterns 75A may include or may be formed of the pad spacer layer 77 and the spacer capping layer 78.

Figure 36:
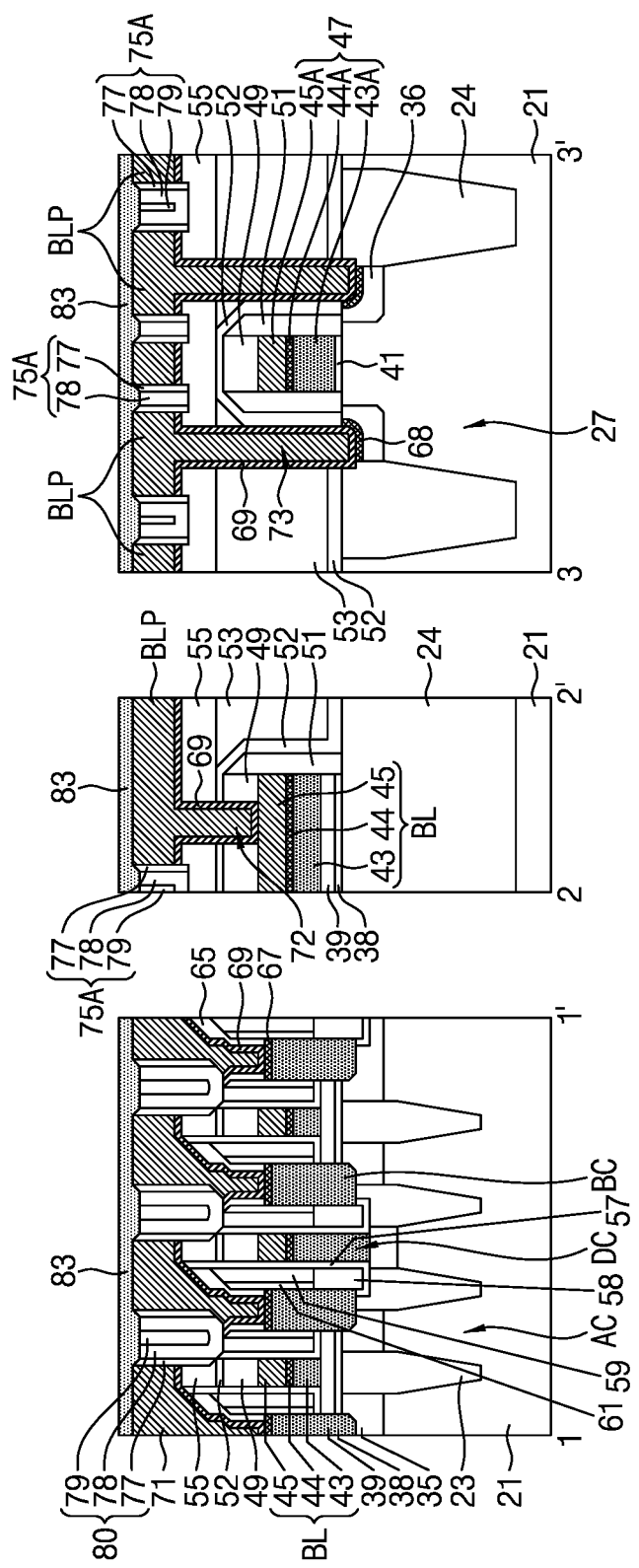

Referring to FIG. 36, an etch stop layer 83 may be formed on the plurality of landing pads 71, the plurality of first insulating patterns 75A, the plurality of second insulating patterns 80 and the plurality of second bit lines BLP.

Referring to FIGS. 2 and 10, a plurality of cell capacitors 95 may be formed on the plurality of landing pads 71. A fifth insulating layer 99 may be formed on the etch stop layer 83 at the peripheral area PE.

In accordance with the exemplary embodiments of the disclosure, a plurality of first insulating patterns may be disposed among a plurality of second bit lines, and a plurality of second insulating patterns may be disposed among a plurality of landing pads. Upper surfaces of the plurality of second bit lines and the plurality of landing pads may be substantially coplanar. The plurality of first insulating patterns includes a layer different from that of the plurality of second insulating patterns. A semiconductor device having excellent electrical characteristics while being advantageous in terms of high integration may be realized.

While the embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:

1. A semiconductor device comprising:
a substrate comprising a cell area, and a peripheral area adjacent to the cell area;
a plurality of first bit lines disposed on the cell area of the substrate;
a plurality of buried contacts disposed in a plurality of spaces between first bit lines of the plurality of first bit lines and connected to the substrate;
a plurality of landing pads on the plurality of buried contacts;
a plurality of second bit lines disposed on the peripheral area of the substrate and connected to the plurality of first bit lines, upper surfaces of the plurality of second bit lines being substantially coplanar with upper surfaces of the plurality of landing pads;
a plurality of first insulating patterns disposed in a plurality of spaces between second bit lines of the plurality of second bit lines;
a plurality of second insulating patterns disposed in a plurality of spaces between landing pads of the plurality of landing pads;
an etch stop layer on the plurality of landing pads, the plurality of second bit lines, the plurality of first insulating patterns and the plurality of second insulating patterns; and
a plurality of cell capacitors connected to the plurality of landing pads,
wherein the plurality of first insulating patterns comprises an insulating layer different from at least one insulating layer of the plurality of second insulating patterns.

2. The semiconductor device according to claim 1, wherein the plurality of second bit lines comprise the same material layer as the plurality of landing pads.

3. The semiconductor device according to claim 1, wherein:
each of the plurality of second insulating patterns comprises
a filling layer,
a spacer capping layer surrounding a side surface and a bottom of the filling layer, and
a pad spacer layer outside the spacer capping layer; and
the plurality of first insulating patterns comprise an insulating layer different from insulating layers of the filling layer, the spacer capping layer and the pad spacer layer.

4. The semiconductor device according to claim 3, wherein the plurality of first insulating patterns contact side surfaces of the plurality of second bit lines.

5. The semiconductor device according to claim 3, wherein the filling layer, the spacer capping layer and the pad spacer layer are not present among side surfaces of the plurality of first insulating patterns and the plurality of second bit lines.

6. The semiconductor device according to claim 3, wherein the spacer capping layer extends between the etch stop layer and at least one of the plurality of first insulating patterns and between the etch stop layer and at least one of the plurality of second bit lines.

7. The semiconductor device according to claim 3, wherein the pad spacer layer extends between the etch stop layer and at least one of the plurality of first insulating patterns and between the etch stop layer and at least one of the plurality of second bit lines.

8. The semiconductor device according to claim 3, further comprising:
a plurality of inner spacers on the plurality of first bit lines;
a plurality of outer spacers facing the plurality of inner spacers; and
a plurality of air gaps between the plurality of inner spacers and the plurality of outer spacers.

9. The semiconductor device according to claim 8, wherein the plurality of air gaps is disposed between the plurality of first bit lines and the plurality of buried contacts.

10. The semiconductor device according to claim 8, wherein the spacer capping layer covers a top of the plurality of air gaps.

11. The semiconductor device according to claim 3, wherein:
the filling layer and the pad spacer layer comprises silicon nitride; and
the spacer capping layer comprises SiCN.

12. The semiconductor device according to claim 1, wherein the upper surfaces of the plurality of landing pads, the upper surfaces of the plurality of second bit lines, upper surfaces of the plurality of first insulating patterns and upper surfaces of the plurality of second insulating patterns are coplanar with each other.

13. The semiconductor device according to claim 1, further comprising:
a plurality of bit line contact plugs disposed between the plurality of first bit lines and the plurality of second bit lines while being adjacent to a boundary between the cell area and the peripheral area,
wherein the plurality of first bit lines extends from the cell area into the peripheral area, and
wherein the uppermost ends of the plurality of second bit lines are higher than uppermost ends of the plurality of first bit lines.

14. The semiconductor device according to claim 13, wherein each of the plurality of bit line contact plugs is continuity with a corresponding one of the plurality of second bit lines.

15. The semiconductor device according to claim 13, wherein the plurality of bit line contact plugs comprises the same material as the plurality of second bit lines.

16. The semiconductor device according to claim 1, wherein each of the plurality of cell capacitors comprises:
a lower electrode extending through the etch stop layer, to contact a corresponding one of the plurality of landing pads;

an upper electrode facing the lower electrode; and
a capacitor dielectric layer between the lower electrode and the upper electrode.

17. A semiconductor device comprising:
a substrate comprising a first area, and a second area adjacent to the first area;
a plurality of first horizontal wirings disposed on the first area of the substrate;
a plurality of vertical wirings disposed in a plurality of spaces between first horizontal wirings of the plurality of first horizontal wirings and connected to the substrate;
a plurality of landing pads on the plurality of vertical wirings;
a plurality of second horizontal wirings disposed on the second area of the substrate and connected to the plurality of first horizontal wirings, upper surfaces of the plurality of second horizontal wirings being substantially coplanar with upper surfaces of the plurality of landing pads;
a plurality of first insulating patterns disposed in a plurality of spaces between second horizontal wirings of the plurality of second horizontal wirings;
a plurality of second insulating patterns disposed in a plurality of spaces between landing pads of the plurality of landing pads; and
a plurality of lower electrodes on the plurality of landing pads,
wherein the plurality of first insulating patterns comprises an insulating layer different from at least one insulating layer of the plurality of second insulating patterns.

18. The semiconductor device according to claim 17, wherein:
each of the plurality of second insulating patterns comprises
a first insulating layer,
a second insulating layer surrounding a side surface and a bottom of the second insulating layer, and
a third insulating layer outside the second insulating layer;
the second insulating layer comprises a material different from those of the first insulating layer and the third insulating layer; and
the plurality of first insulating patterns comprises an insulating layer different from the first insulating layer, the second insulating layer and the third insulating layer.

19. The semiconductor device according to claim 18, wherein at least one of the first insulating layer and the second insulating layer is disposed on the plurality of first insulating patterns and the plurality of second horizontal wirings.

20. A semiconductor device comprising:
a substrate comprising a cell area, and a peripheral area adjacent to the cell area;
a plurality of switching elements disposed at the cell area of the substrate;
a plurality of first bit lines disposed on the cell area of the substrate and connected to the plurality of switching elements;
a plurality of buried contacts disposed in a plurality of spaces between first bit lines of the plurality of first bit lines and connected to the plurality of switching elements;
a plurality of landing pads on the plurality of buried contacts;
a plurality of second bit lines disposed on the peripheral area of the substrate and connected to the plurality of first bit lines, upper surfaces of the second bit lines being substantially coplanar with upper surfaces of the plurality of landing pads;
a plurality of first insulating patterns disposed in a plurality of spaces between second bit lines of the plurality of second bit lines;
a plurality of second insulating patterns disposed in a plurality of spaces between landing pads of the plurality of landing pads;
an etch stop layer on the plurality of landing pads, the plurality of second bit lines, the plurality of first insulating patterns, and the plurality of second insulating patterns; and
a plurality of storage nodes connected to the plurality of landing pads while extending through the etch stop layer,
wherein the plurality of first insulating patterns comprises an insulating layer different from at least one insulating layer of the plurality of second insulating patterns.

* * * * *